(12) United States Patent
Tojo et al.

(10) Patent No.: US 10,573,603 B2
(45) Date of Patent: Feb. 25, 2020

(54) SEMICONDUCTOR DEVICE HAVING A THREE-SIDED TEXTURED SUBSTRATE

(71) Applicant: Kabushiki Kaisha Toshiba, Minato-ku (JP)

(72) Inventors: Akira Tojo, Naka (JP); Tatsuya Kobayashi, Yokohama (JP); Kazuo Shimokawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/912,616

(22) Filed: Mar. 6, 2018

(65) Prior Publication Data

US 2018/0286819 A1  Oct. 4, 2018

(30) Foreign Application Priority Data

Mar. 29, 2017 (JP) .................................. 2017-064974

(51) Int. Cl.
| | |
|---|---|
| *H01L 31/02* | (2006.01) |
| *H01L 23/00* | (2006.01) |
| *H01L 21/78* | (2006.01) |
| *H01L 31/0236* | (2006.01) |

(52) U.S. Cl.
CPC ............ *H01L 23/562* (2013.01); *H01L 21/78* (2013.01); *H01L 31/02363* (2013.01)

(58) Field of Classification Search
CPC .................... H01L 23/562; H01L 31/02363
See application file for complete search history.

(56) References Cited

U.S. PATENT DOCUMENTS

| 7,443,693 | B2 * | 10/2008 | Arnold | H01L 23/04 |
| | | | | 361/800 |
| 7,667,224 | B2 * | 2/2010 | Ohashi | H01L 33/20 |
| | | | | 257/13 |
| 8,017,415 | B2 * | 9/2011 | Zimmerman | H01L 21/02389 |
| | | | | 257/E21.121 |
| 8,471,285 | B2 * | 6/2013 | Hsu | H01L 33/60 |
| | | | | 257/676 |
| 9,059,167 | B2 | 6/2015 | Farooq et al. | |

(Continued)

FOREIGN PATENT DOCUMENTS

| JP | 09-129524 | 5/1997 |
| JP | 09-213595 | 8/1997 |

(Continued)

*Primary Examiner* — Ida M Soward
(74) *Attorney, Agent, or Firm* — Oblon, McClelland, Maier & Neustadt, L.L.P.

(57) ABSTRACT

A semiconductor device includes a substrate, a device layer, and a film. The substrate includes a first semiconductor element, and has a first surface, a second surface, and a side surface between the first surface and the second surface. The device layer includes a second semiconductor element electrically connected to the first semiconductor element, and is provided on the first surface of the substrate. The film includes a first film including a first region, a second region, and a third region. The substrate is positioned between the first region and the device layer in a first direction. The substrate is positioned between the second region and the third region in a second direction crossing the first direction. The first film fills the unevenness of the second surface and the side surface.

10 Claims, 23 Drawing Sheets

(56) References Cited

U.S. PATENT DOCUMENTS

| | | | | |
|---|---|---|---|---|
| 9,087,956 B2* | 7/2015 | Kim | H01L 31/02245 | |
| 9,136,432 B2* | 9/2015 | Yun | H01L 33/14 | |
| 9,293,661 B2* | 3/2016 | Hoppel | H01L 23/49827 | |
| 9,343,637 B2* | 5/2016 | Engl | H01L 33/405 | |
| 9,859,464 B2* | 1/2018 | DeMille | H01L 33/22 | |
| 2001/0028506 A1* | 10/2001 | Fujimoto | B41J 2/451 | |
| | | | 359/622 | |
| 2005/0112800 A1 | 5/2005 | Yamano | | |
| 2007/0262336 A1* | 11/2007 | Tamaki | H01L 33/60 | |
| | | | 257/98 | |
| 2009/0115042 A1 | 5/2009 | Koyanagi | | |
| 2011/0049538 A1* | 3/2011 | Yang | H01L 33/44 | |
| | | | 257/88 | |
| 2011/0272702 A1* | 11/2011 | Kwon | H01L 27/10867 | |
| | | | 257/71 | |
| 2011/0315204 A1* | 12/2011 | Gleason | B82Y 10/00 | |
| | | | 136/256 | |
| 2013/0153947 A1* | 6/2013 | Lim | H01L 33/22 | |
| | | | 257/98 | |
| 2014/0284783 A1* | 9/2014 | Sayama | H01L 23/34 | |
| | | | 257/690 | |
| 2015/0023023 A1* | 1/2015 | Livesay | H01L 33/642 | |
| | | | 362/294 | |
| 2015/0034963 A1* | 2/2015 | Kinouchi | H01L 33/20 | |
| | | | 257/76 | |
| 2015/0091037 A1* | 4/2015 | Jung | H01L 33/405 | |
| | | | 257/98 | |
| 2015/0200334 A1* | 7/2015 | Chae | H01L 33/22 | |
| | | | 257/98 | |
| 2016/0043282 A1* | 2/2016 | Chae | H01L 33/22 | |
| | | | 257/98 | |
| 2016/0056352 A1* | 2/2016 | Koike | H01L 33/22 | |
| | | | 257/98 | |
| 2016/0093771 A1* | 3/2016 | Shatalov | H01L 21/0237 | |
| | | | 257/94 | |
| 2016/0111613 A1* | 4/2016 | Im | H01L 33/0079 | |
| | | | 257/13 | |
| 2017/0352783 A1* | 12/2017 | Ishizaki | H01L 33/30 | |

FOREIGN PATENT DOCUMENTS

| | | |
|---|---|---|
| JP | 2002-043251 A | 2/2002 |
| JP | 2005-158929 | 6/2005 |
| JP | 2008-016606 A | 1/2008 |
| JP | 2012-037406 | 2/2012 |
| JP | 2013-160556 | 8/2013 |
| JP | 2015-056571 A | 3/2015 |
| TW | 201003858 | 1/2010 |
| TW | 201120950 A | 6/2011 |
| WO | WO 2005/119776 A1 | 12/2005 |

* cited by examiner

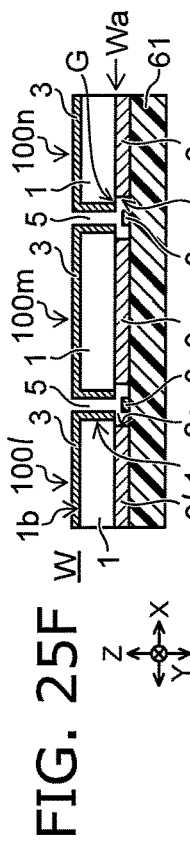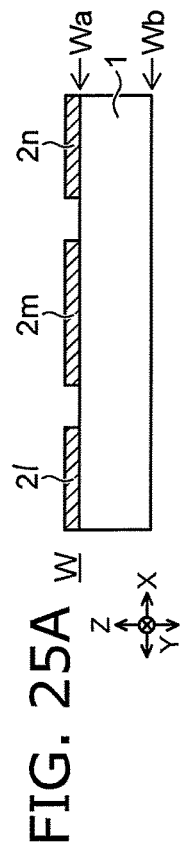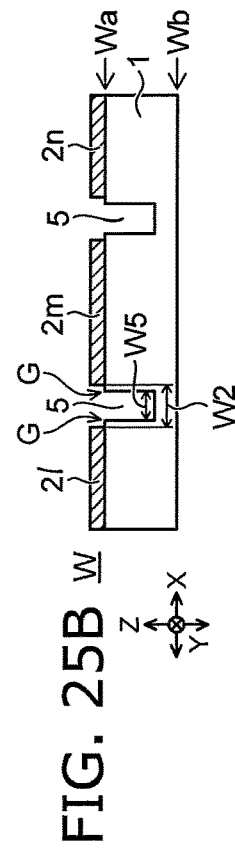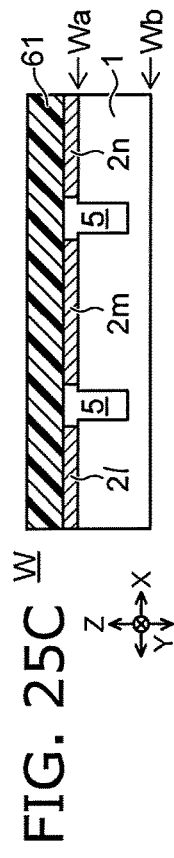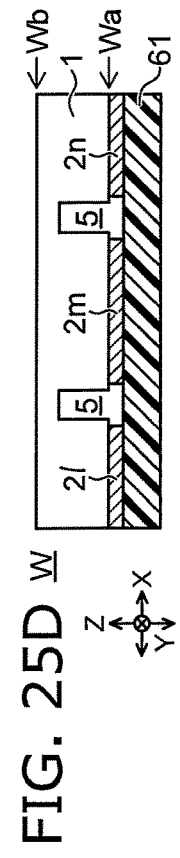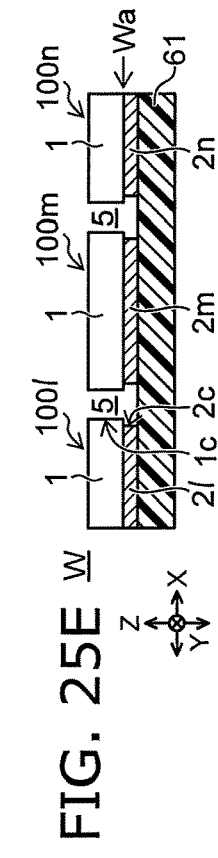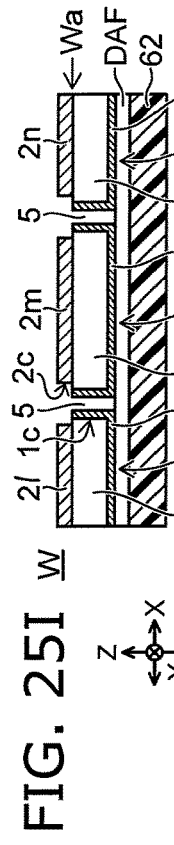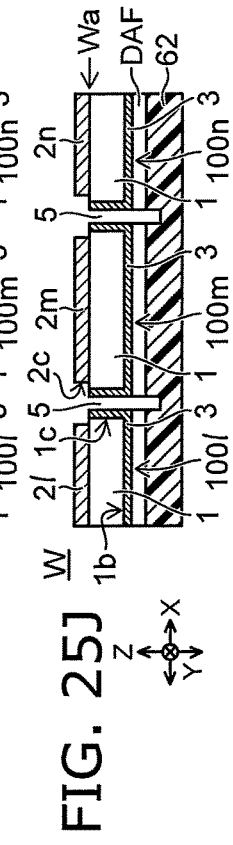

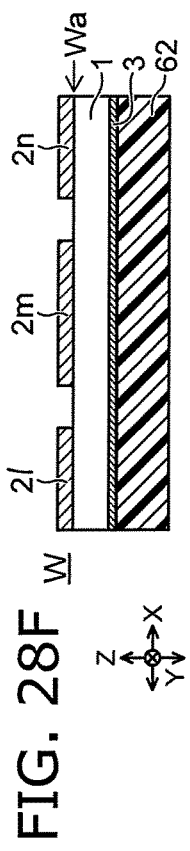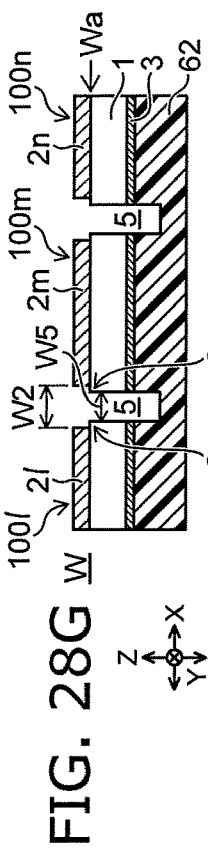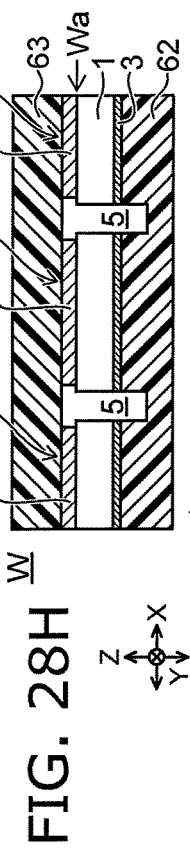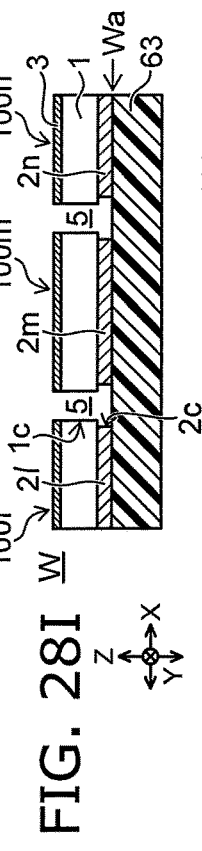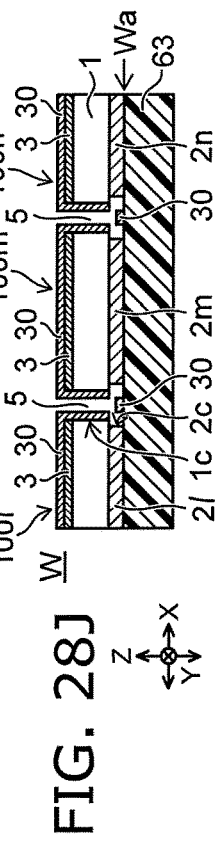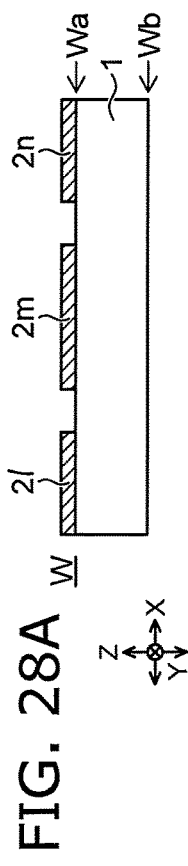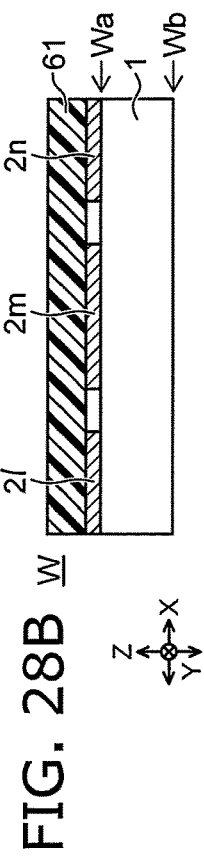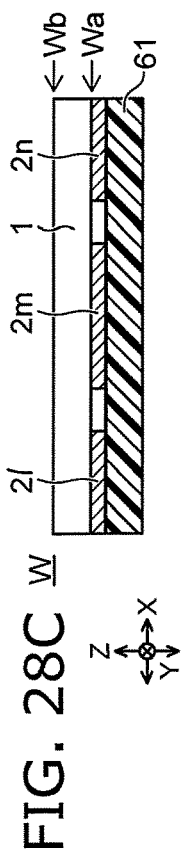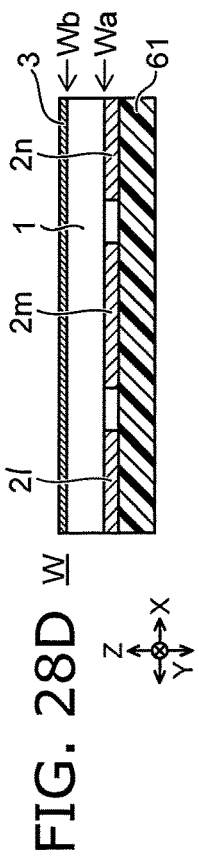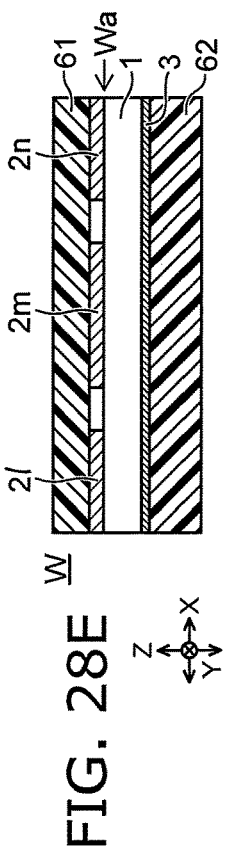

SEMICONDUCTOR DEVICE HAVING A THREE-SIDED TEXTURED SUBSTRATE

CROSS-REFERENCE TO RELATED APPLICATIONS

This application is based upon and claims the benefit of priority from Japanese Patent Application No. 2017-064974, filed on Mar. 29, 2017; the entire contents of which are incorporated herein by reference.

FIELD

Embodiments described herein relate to a semiconductor device and a method for manufacturing the same.

BACKGROUND

The thinning of semiconductor chips has been progressing. There are now increased occurrences of "warping" in thinned semiconductor chips. Suppression of this "warping" is desired.

BRIEF DESCRIPTION OF THE DRAWINGS

FIG. 25A to FIG. 25J are procedural schematic cross-sectional views illustrating a method for manufacturing a semiconductor device according to a third embodiment;

FIG. 28A to FIG. 28J are procedural schematic views illustrating a method for manufacturing a semiconductor device according to a fourth embodiment.

DETAILED DESCRIPTION

Figure 1:
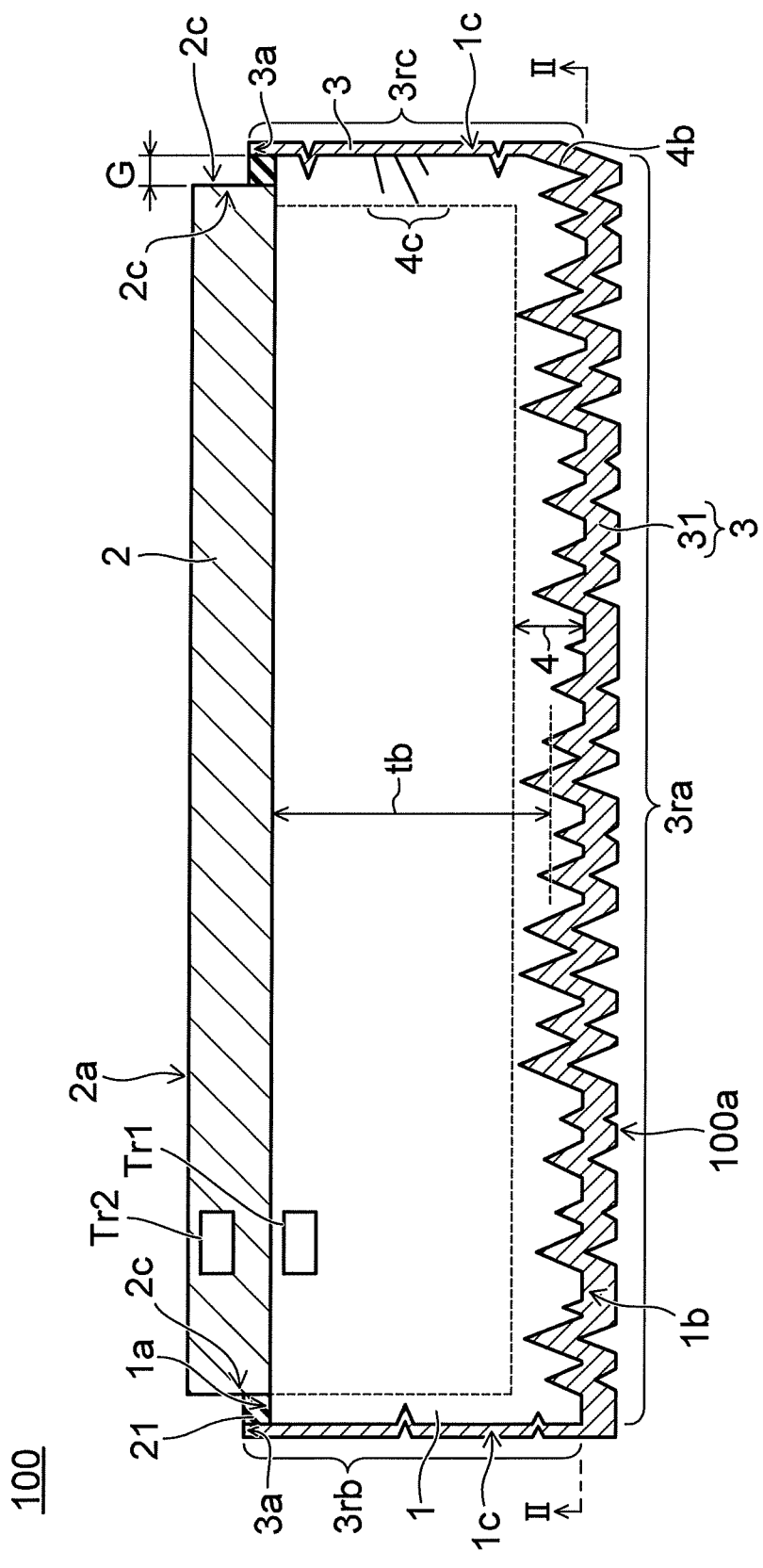
FIG. 1 is a schematic cross-sectional view illustrating a semiconductor device according to a first embodiment.

According to one embodiment, a semiconductor device includes a substrate, a device layer, and a film. The substrate includes a first semiconductor element, and has a first surface, a second surface, and a side surface between the first surface and the second surface. The device layer includes a second semiconductor element electrically connected to the first semiconductor element, and is provided on the first surface of the substrate. The film includes a first film including a first region, a second region, and a third region. The substrate is positioned between the first region and the device layer in a first direction. The substrate is positioned between the second region and the third region in a second direction crossing the first direction. The first film fills the unevenness of the second surface and the side surface.

Embodiments of the invention will now be described in the following with reference to the drawings.

Note that the drawings are schematic or simplified illustrations and that relationships between thicknesses and widths of parts and proportions in size between parts may differ from actual parts. Also, even where identical parts are illustrated, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

First Embodiment

Figure 2:
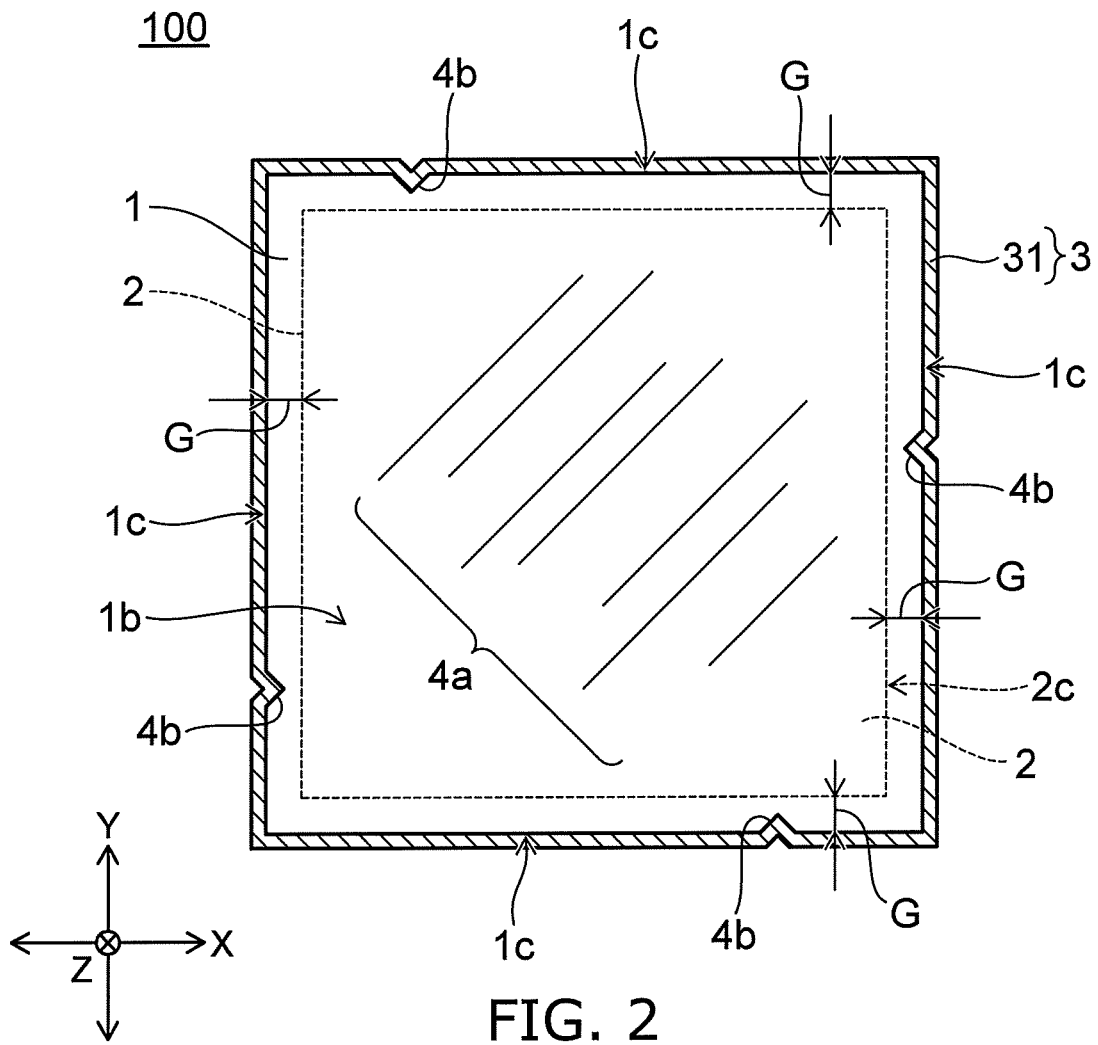
FIG. 2 is a schematic cross-sectional view along the II-II line in FIG. 1.
Figure 3:
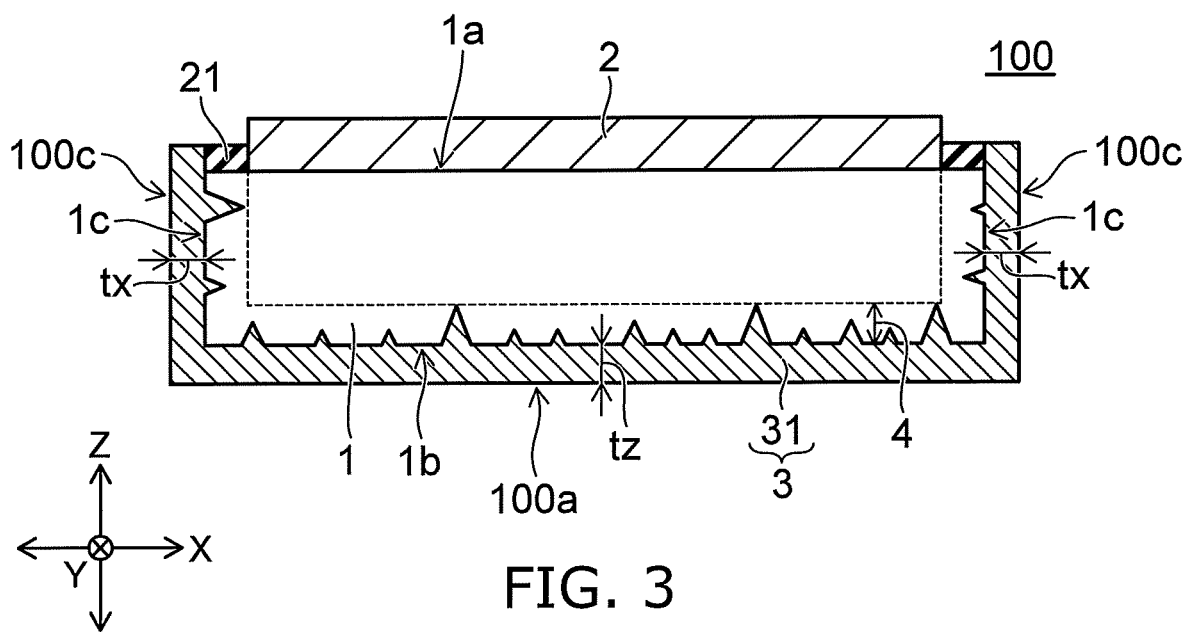
FIG. 3 is a schematic cross-sectional view illustrating the semiconductor device according to the first embodiment.

FIG. 1 is a schematic cross-sectional view illustrating a semiconductor device according to a first embodiment. FIG. 2 is a schematic cross-sectional view along the II-II line in FIG. 1. FIG. 3 is a schematic cross-sectional view illustrating the semiconductor device according to the first embodiment.

The first direction, second direction, and third direction are shown in FIG. 1 to FIG. 3. In the specification, the first direction is defined as a Z-axis direction. One direction crossing, for example, orthogonal to the Z-axis direction, is defined as the second direction. The second direction is the X-axis direction. One direction crossing, for example, orthogonal to both the Z-axis direction and the X-axis direction, is defined as the third direction. The third direction is the Y-axis direction.

As shown in FIG. 1 to FIG. 3, the semiconductor device according to the first embodiment includes a substrate 1, a device layer 2, and a film 3 including a first film 31. The semiconductor device according to the first embodiment is, for example, a first semiconductor chip 100 sliced from a semiconductor wafer.

The substrate 1 includes a first surface 1a, a second surface 1b, and a side surface 1c. The second surface 1b is separated from the first surface 1a in the Z-axis direction. The side surface 1c is between the first surface 1a and second surface 1b. The substrate 1 includes a first semiconductor element Tr1. The substrate 1 includes a semiconductor, for example, silicon (Si), and an n-type well region, a p-type well region, and a device isolation region are provided on a side of the first surface 1a. For example, the first semiconductor element is provided on the n-type well region and the p-type well region. The first semiconductor element Tr1 includes, for example, a transistor. In FIG. 1, an illustration of the n-type well region, p-type well region, and device isolation region is omitted.

The device layer 2 is provided on the first surface 1a. The device layer 2 includes, for example, a second semiconductor device Tr2, an electric wire, an insulator, and a resin layer (for example, polyimide) from a side of the substrate 1. For example, the second semiconductor element Tr2 includes, for example, a transistor or a memory cell. For example, the second semiconductor element Tr2 is electrically connected to the first semiconductor element Tr1 through an electric wire (not illustrated). In FIG. 1, an illustration of the electric wire, insulator, and resin layer is omitted. An electric wire and a metal layer of aluminum (Al) or the like that functions as an electrode is provided on an upper surface 2a of the device layer 2. In FIG. 1, an illustration of the metal layer is omitted.

The film 3 including the first film 31 includes a first region 3ra, a second region 3rb, and a third region 3rc. The substrate 1 is positioned between the first region 3ra and the device layer 2 in the Z-axis direction, and is positioned between the second region 3rb and the third region 3rc in the X-axis direction. The first film 31 covers, for example, the second surface 1b of substrate 1, and the side surface 1c of the substrate 1. In the first embodiment, the film 3 is, for example, one film provided continuously from on the second surface 1b of the substrate 1 to on the side surface 1c of the substrate 1. For example, the first film 31 is a film with an integral structure.

In the first embodiment, a gap G is provided between the side surface 1c of the substrate 1 and the side surface 2c of the device layer 2. The film 3 is separated from the device layer 2. The film 3 is provided on the side surface 1c of the substrate 1, however, for example, it is not provided on the first surface 1a in the gap G and on the device layer 2. In the gap G, a structure 21 is provided on the first surface 1a of the substrate 1. The structure 21 includes, for example, an insulator. The structure 21 may also include an insulator, and a metal layer of Al or the like. The structure 21 may also include an insulator, a metal layer, and a resin layer provided on the metal layer. One example of the width in the X-direction for the gap G is not less than 5 μm and not more than 100 μm. In particular, although not illustrated, the width in the Y-direction of the gap G is also, for example, not less than 5 μm and not more than 100 μm. The width in the X-axis direction and the width in the Y-axis direction of the gap G vary according to the design. The width in the X-axis direction and the width in the Y-axis direction of the gap G are not limited to not less than 5 μm and not more than 100 μm.

The substrate 1 is, for example, thinned. The second surface 1b of the thinned substrate 1 has, for example, minute surface roughness. The minute surface roughness causes a minute unevenness 4 on the second surface 1b. The minute surface unevenness 4 may also include, for example, a scratch (microscratch) 4a as illustrated in FIG. 2. The scratch 4a is, for example, a "grinding mark" formed in the Back Side Grinding (BSG) process. The BSG process is performed when the substrate 1 is thinned. For example, the substrate 1 having the scratch 4a on the second surface 1b is thinned. The minute unevenness 4 also occurs on the side surface 1c. The minute unevenness 4 of the side surface 1c occurs, for example, together with a chipping 4b or the like in dicing.

In the first semiconductor chip 100, the second surface 1b of the substrate 1 and the side surface 1c of the substrate 1 are covered by the film 3 including the first film 31. The first film 31 suppresses deformations of the substrate 1. The first film 31 mitigates the force of the device layer 2 that attempts to deform the substrate 1, for example, on the second surface 1b of the substrate 1. The first film 31 is, for example, a stress load layer.

According to the first embodiment, for example, a thickness tb of the substrate 1 is thinned, and deformation of the substrate 1 can be suppressed, even in a case where transverse strength of the substrate 1 itself decreases. Thus, for example, "warping" of the first semiconductor chip 100 can be suppressed. The thickness tb of the substrate 1 is the thickness of the substrate 1 in the Z-axis direction.

In the first embodiment, the minute unevenness 4 of the second surface 1b and side surface 1c is filled by the film 3. The surface roughness of a back surface 100a of the first semiconductor chip 100 can be reduced in comparison to when the back surface 100a remains as the second surface 1b of the substrate 1. The surface roughness of a side surface 100c of the first semiconductor chip 100 can also be reduced in comparison to when the side surface 100c remains as the side surface 1c of the substrate 1. According to the first embodiment in which the surface roughness of the back surface 100a of the first semiconductor chip 100 can be reduced, for example, it is also possible to omit a treatment that decreases the minute unevenness 4 (for example, dry polishing or the like), implemented after the BSG process.

Surface roughness of the back surface 100a or side surface 100c of the first semiconductor chip 100 affects the strength of the substrate 1. For example, surface roughness of the back surface 100a or side surface 100c reduces "transverse strength" of the substrate 1, and also promotes, for example, "breakability" of the substrate 1. Note that in the specification "substrate 1 breaks" includes "substrate 1 breaks" and "substrate 1 cracks". In the case where transverse strength of the substrate 1 decreases, it becomes likely that substrate 1 will deform when it is made into individual pieces. In a case where the substrate 1 becomes breakable, substrate 1 will become more likely to be damaged in processes where a load such as bending stress or the like is applied to the substrate 1, such as a pick-up process and mounting process or the like.

In the first embodiment, the film 3 is provided on the second surface 1b of the substrate 1, thus, for example, a decrease in strength of the substrate 1 caused by the minute unevenness 4 of the second surface 1b can be suppressed. The minute unevenness 4 of the second surface 1b, for example, strongly affects transverse strength. According to the first embodiment, for example, "warping" of the first semiconductor chip 100 can be suppressed.

Furthermore, in the first embodiment, the film 3 is also provided on the side surface 1c of the substrate 1. The film 3 including the first film 31 mitigates the force of the device layer 2 that attempts to deform the substrate 1, for example, even on the side surface 1c of the substrate 1. In addition to this advantage, for example, a decrease in strength of the substrate 1 caused by the minute unevenness 4 of the side surface 1c can be further suppressed. The minute unevenness 4 of the side surface 1c, for example, affects the "breakability" of the substrate 1. According to the first embodiment, for example, "breaking" of the first semiconductor chip 100 can be suppressed. In particular, the first semiconductor chip 100 becomes even less likely to be damaged in the pick-up process and mounting process or the like.

Additionally, in the first embodiment, the film 3 is provided as one film, continuous from on the second surface 1b of the substrate 1 to on the side surface 1c of the substrate 1. According to this kind of film 3 including the first film 31, for example, "peeling resistance" from the substrate 1 improves. "Peeling resistance" of the film 3 including the first film 31 improves, so the first film 31 is stable on the substrate 1. The first film 31 is stable on the substrate 1, so an effect can be further obtained where, for example, "warping" and "breaking" of the first semiconductor chip 100 can be suppressed.

There is also a case where, for example, chipping 4b is generated on the second surface 1b of the substrate 1 and the side surface 1c of the substrate 1. In this case, the minute unevenness 4 further includes the chipping 4b. The chipping 4b, for example, is a "dicing mark" formed in the dicing process. Also, the chipping 4b is a "minute crack" in the substrate 1, generated in the dicing process or BSG process. For example, the substrate 1 is diced, with the chipping 4b on the second surface 1b and side surface is of the substrate 1. There are occasions where the chipping 4b enlarges the surface roughness of the second surface 1b of the substrate 1 and the surface roughness of the side surface 1c of the substrate 1.

In the first embodiment, the chipping 4b is filled by the film 3. The minute unevenness 4 including the chipping 4b becomes smaller. Accordingly, in the first embodiment, "warping" and "cracking" of the first semiconductor chip 100 can be suppressed, even in cases where there is minute unevenness 4 including chipping 4b on the second surface 1b of the substrate 1 and the side surface 1c of the substrate 1.

There is also a case where, for example, a crack 4c is generated on the side surface 1c of the substrate 1. The crack 4c reaching the side surface 1c of the substrate 1, for example, can become an invasion route into the substrate 1 by impurities such as, for example, metal, moisture, and organic matter or the like, or ions. In a case where impurities or ions invade into the substrate 1, for example, there is a possibility that operation, for example, of the first semiconductor chip 100 will become unstable. In addition, the crack 4c itself becomes a cause of decrease in strength of the substrate 1.

In the first embodiment, the crack 4c is sealed by the film 3 including the first film 31. According to the first embodiment, infiltration of impurities into the substrate 1 can be suppressed, in comparison to when there is no film 3 on the side surface 1c. Accordingly, operation of the first semiconductor chip 100, for example, can also be stabilized over a long period of time. Even in the case where the crack 4c is generated on the side surface 1c of the substrate 1, suppression of a decrease in strength of the first semiconductor chip 100 or an improvement in strength of the first semiconductor chip 100 can be sought. An effect can be further obtained where, for example, "warping" and "breaking" of the first semiconductor chip 100 can be suppressed.

As shown in FIG. 3, the effect wherein the minute unevenness 4 is filled, for example, increases as a thickness tx in the X-axis direction of the film 3 and a thickness tz in the Z-axis direction of the film 3 is made thicker. For example, it is also likely that the surface of the back surface 100a of the first semiconductor chip 100 and the surface of the side surface 100c of the first semiconductor chip 100 are brought exceedingly close to flat. The surface roughness of the back surface 100a of the first semiconductor chip 100 and the surface roughness of the side surface 100c of the first semiconductor chip 100 each become smaller. In a case where the surface roughness of the back surface 100a of the first semiconductor chip 100 and the surface roughness of the side surface 100c of the first semiconductor chip 100 can be made smaller, an effect can be further obtained where, for example, "warping" and "breaking" of the first semiconductor chip 100 can be suppressed.

Figure 4A:
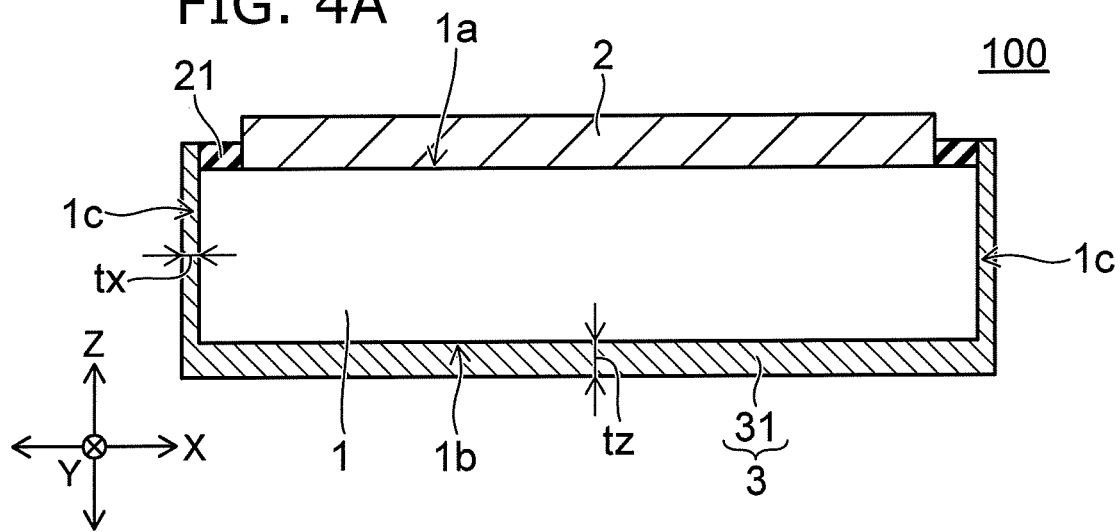
FIG. 4A to FIG. 4C are schematic cross-sectional views illustrating the semiconductor device according to the first embodiment.
Figure 4B:
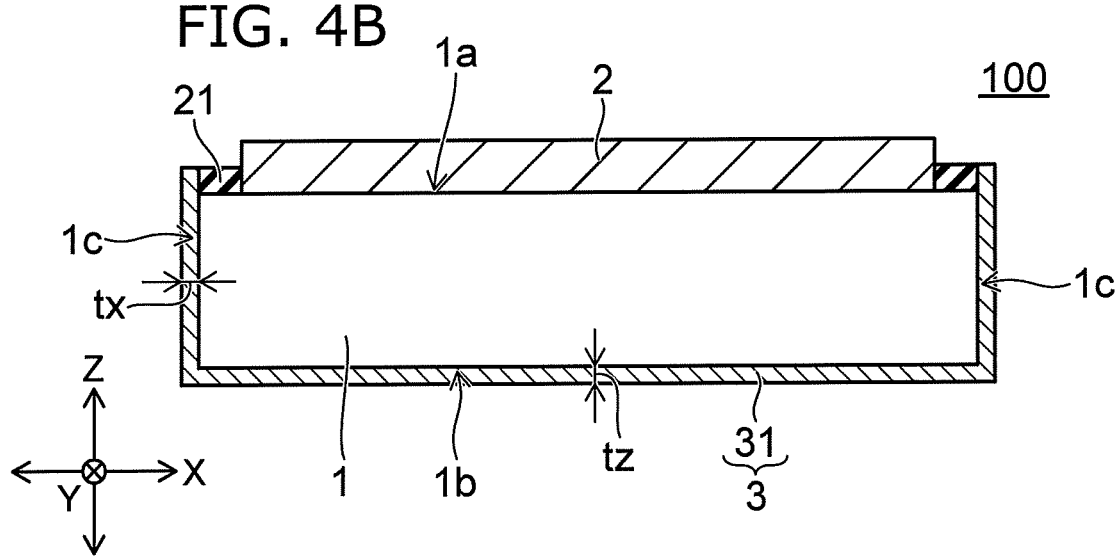
Figure 4C:
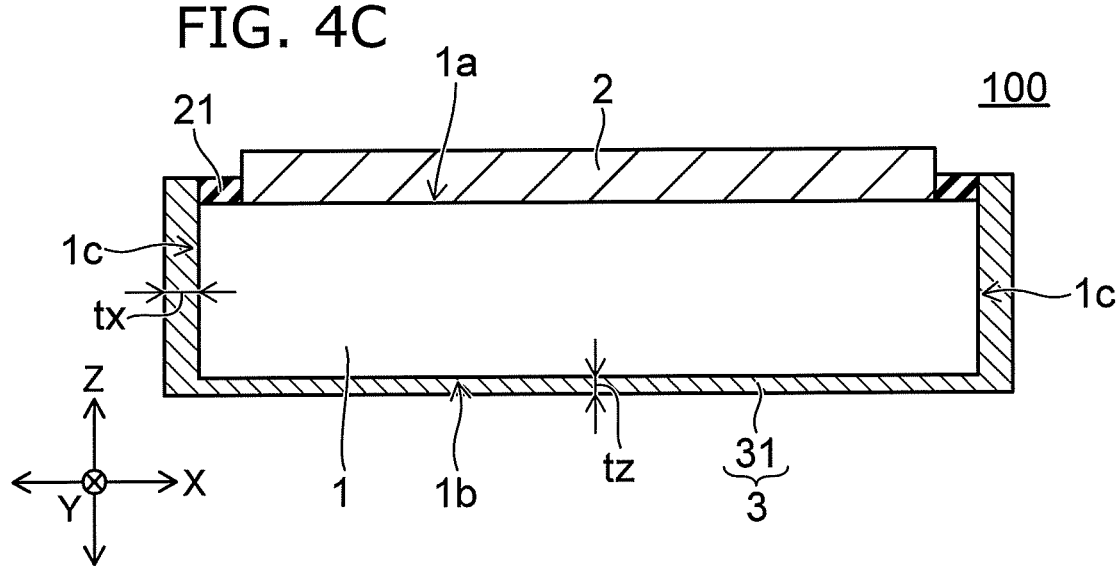

FIG. 4A to FIG. 4C are schematic cross-sectional views illustrating the semiconductor device according to the first embodiment. The relationship between the thickness tx in the X-axis direction of the film 3 and the thickness tz in the Z-axis direction of the film 3 is shown in FIG. 4A to FIG. 4C. Note that illustrations for the minute unevenness 4 are omitted in FIG. 4A to FIG. 4C.

As shown in FIG. 4A to FIG. 4C, the relationship between the thickness tx in the X-axis direction of the film 3 and the thickness tz in the Z-axis direction of the film 3 is not particularly limited. For example, it may be "tx<tz (FIG. 4A)", "tx=tz (FIG. 4B)", or "tx>tz (FIG. 4C)".

As shown in FIG. 4A, when "tx<tz", of the advantage wherein "warping" can be suppressed and the advantage wherein "breaking" can be suppressed, for example, the former advantage can be more powerfully obtained.

As shown in FIG. 4B, when "tx=tz", each advantage wherein "warping" and "breaking" can be suppressed, for example, can be sufficiently obtained.

As shown in FIG. 4C, when "tx>tz", of the advantage wherein "warping" can be suppressed and the advantage wherein "breaking" can be suppressed, for example, the latter advantage can be more powerfully obtained. Furthermore, for example, an advantage can be obtained wherein the thickness in the Z-axis direction of the first semiconductor chip 100 can easily be made thin.

The thickness tx in the X-axis direction of the film 3 and the thickness tz in the Z-axis direction of the film 3, for example, can be calculated from a cross-sectional observation image, enlarged using a measurement device such as SEM, TEM or the like. Magnification of the cross-sectional image, for example, is 5000 times. The "likelihood" of the measurement for the thickness tx and thickness tz is improved by increasing the magnification. The measurement location of the thickness tz in the Z-axis direction of the film 3 and the measurement location of the thickness tx in the X-axis direction of the film 3, for example, should be the center cross-section of the substrate 1. For the center cross-section, the center part in the X-axis direction of the substrate 1 or the Y-axis direction of the substrate 1, for example, is almost the center part for the thickness tz, and the center part of the substrate 1 in the Z-axis direction of the substrate 1 is, for example, almost the center part for the thickness tx. For example, the thickness tz in the Z-axis direction of the film 3 and the thickness tx in the X-axis direction of the film 3 in the center cross-section of the substrate 1 are understood from the results of cross section SEM and TEM observation in the X-axis direction, and the results of cross section SEM and TEM observation in the Y-axis direction. The number of semiconductor devices to be measured is appropriately 1 or 3. In the case where there is a plurality of semiconductor devices to be measured, each of the thickness tz in the Z-axis direction of the film 3 and the thickness tx in the X-axis direction of the film 3 is understood, and, for example, an average is taken. Furthermore, when a plurality of semiconductor devices is selected to be measured, it is preferable that one where the first semiconductor chip 100 is positioned in the center of the wafer and one that includes the first semiconductor chip 100 adjacent to the first semiconductor chip 100 positioned in the center are selected.

A material where the force of the device layer 2, for example, can be mitigated can be selected for the material of the first film 31. The first film 31 may be either a metal or a non-metal. The first film 31 may be either conductive or have insulation properties.

Examples of metals that can be used as the material of the first film 31 are described below. Modulus of elasticity E (GPa) and coefficient of linear expansion α (ppm) are also described in the following. Modulus of elasticity E and coefficient of linear expansion α, for example, are measurement values taken at atmospheric pressure (between 100 kPa to 102 kPa, for example, standard atmospheric pressure of 101.325 kPa) and room temperature (approximately 25° C.).

The first film 31 includes at least one metal selected from the group consisting of, for example:
(a) Aluminum (Al) E=70 α=23.0
(b) Gold (Au) E=80 α=14.2
(c) Copper (Cu) E=125 α=16.5
(d) Nickel (Ni) E=205 α=13.5
(e) Titanium (Ti) E=116 α=8.4
(f) Tantalum (Ta) E=185 α=6.3
(g) Tungsten (W) E=370 α=4.5
(h) Palladium (Pd) E=112 α=12.0.

Thermal stress, intrinsic stress due to crystal structure or the like are included in film stress (for example, residual stress) of the first film 31. A material having both a high modulus of elasticity E and coefficient of linear expansion α has high film stress. In a case where film stress is high, it is highly effective in mitigating the force of the device layer 2 that attempts to deform the substrate 1. For example, Ni has both a high modulus of elasticity E and coefficient of linear expansion α. Ni is a material with great intrinsic stress. Ni has high film stress. Ni, for example, is used as a solder alloy barrier layer. Ni is unlikely to undergo a diffusion reaction with other materials. It can be fully expected that Ni also has an advantage in which infiltration of ions into the substrate 1 (for example, Si) and a mold material (for example, resin) can be suppressed. Ni is not as expensive as, for example, W or Ti. Ni is one preferable material as the material of the film 3. For example, in the first embodiment, the first film 31 includes Ni.

The first film 31 may also be an alloy, or a metal alloy, including at least one of the metals (a) to (h). The metal compound, for example, includes an oxide including at least one of the metals (a) to (h) and a nitride including at least one of the metals (a) to (h), and an oxynitride including at least one of the metals (a) to (h), or the like.

When an alloy or a metal compound is used in the material for the first film 31, for example, the first film 31 includes at least one alloy or metal compound selected from the group consisting of:
(i) Aluminum alloy (for example, Al—Si—Cu)
(j) Titanium alloy (for example, TiN)
(k) Tantalum alloy (for example, TaN)
(l) Nickel alloy (for example, Ni—Ti, Ni—Cr, Ni—Cu)
(m) Alumina ($Al_2O_3$).

For example, a nickel alloy can adjust the size of intrinsic stress of Ni. It is possible for film stress of a nickel alloy to be increased, for example, by the film stress of Ni. A Ni alloy is one ideal material as the material of the first film 3.

The first film 31 may also be an alloy including at least one of the metals (a) to (h), in addition to the alloys (i) to (m).

The first film 31 may also be a non-metal. A non-metal that can be practically used as a material of the first film 31 is described below. In the following, the examples of insulator are described as non-metals. Note that the insulator includes a metal compound, for example, aluminum oxide (alumina).

The first film 31 includes at least one non-metal selected from the group consisting of, for example:
(n) Silicon (Si)
(o) Silicon nitride (SiN)
(p) Silicon oxide ($SiO_2$)
(q) Resin.

The metals (a) to (h), alloys, or metal compounds (i) to (m), and non-metals (n) to (q) are merely examples. Metals, alloys, or metal compounds, and non-metals (insulators or the like) other than the foregoing may also be selected.

The materials of the first film 31 described in the first embodiment are also applied to variations of the first embodiment, the second embodiment, and variations of the second embodiment, to be described later.

Figure 5A:
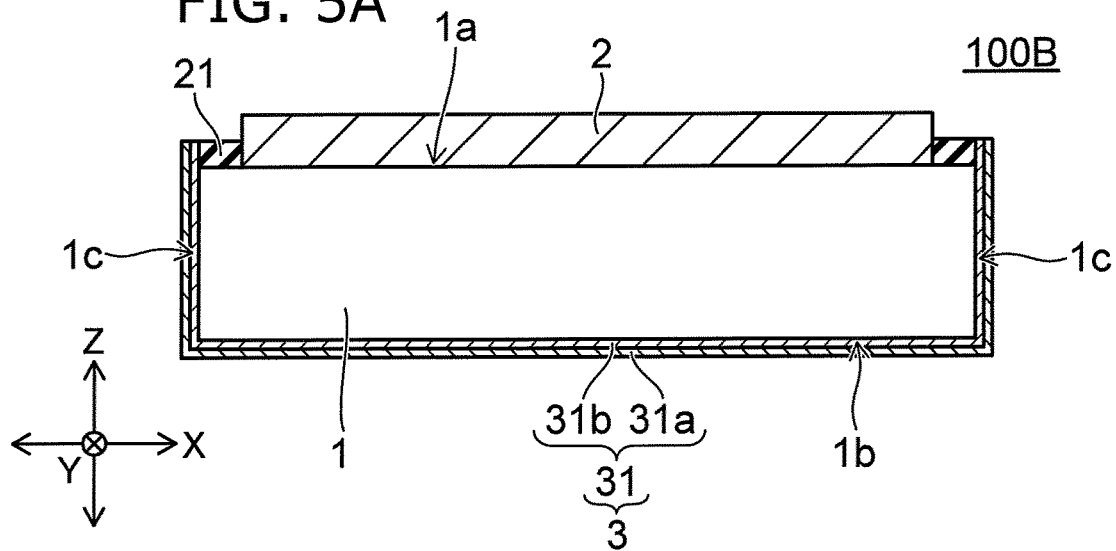
FIG. 5A to FIG. 5C are schematic cross-sectional views illustrating a semiconductor device according to a first variation of the first embodiment.
Figure 5B:
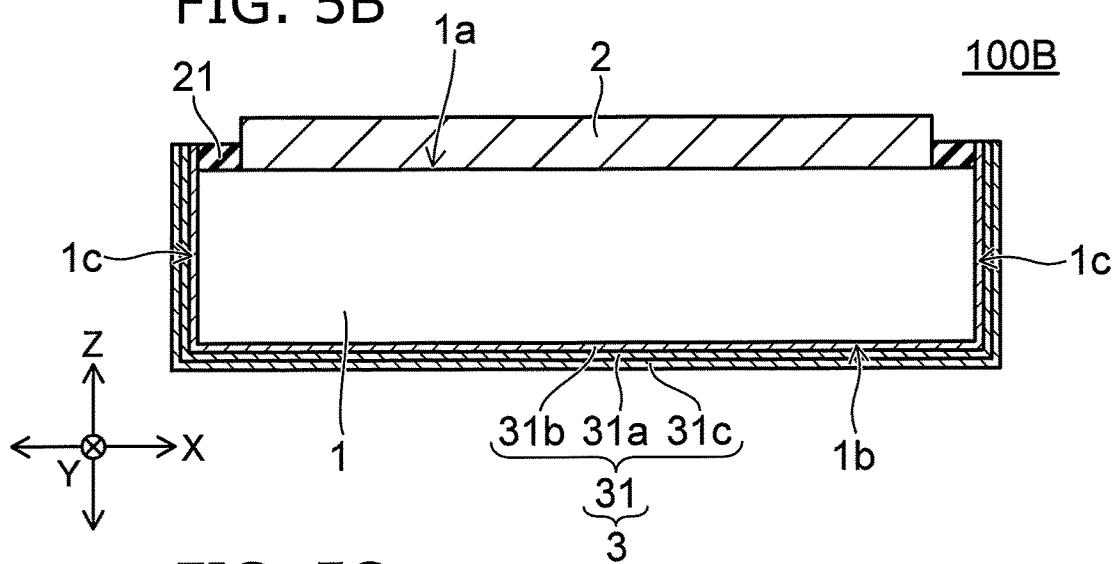
Figure 5C:
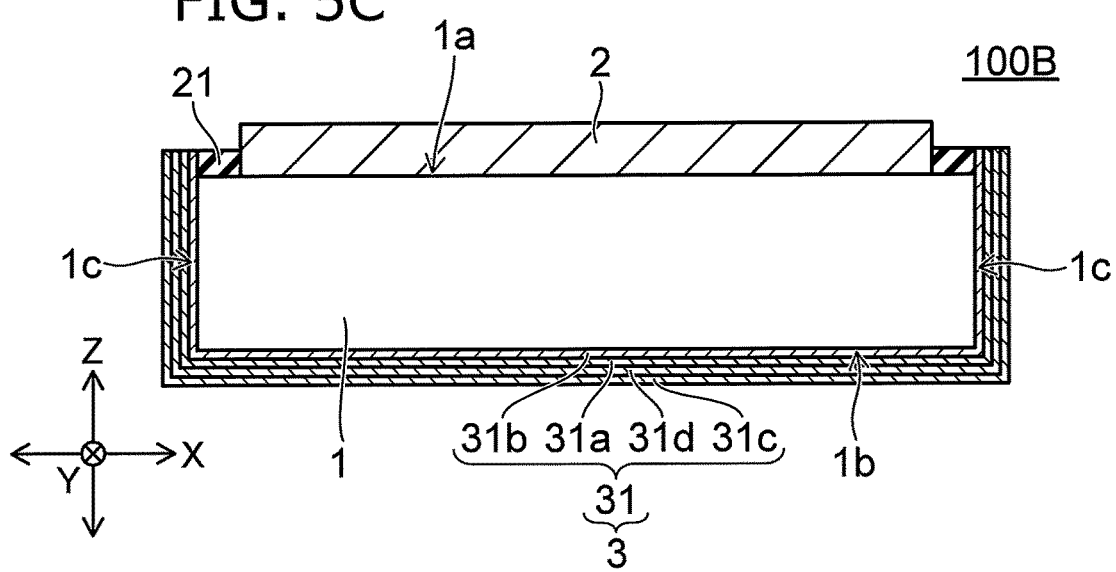

FIG. 5A to FIG. 5C are schematic cross-sectional views illustrating the semiconductor device according to a first variation of the first embodiment. Note that illustrations for the minute unevenness 4 are omitted in FIG. 5A to FIG. 5C.

As shown in FIG. 5A, the first film 31 of a second semiconductor chip 100B according to the first variation includes a first layer 31a, and a second layer 31b. The second layer 31b is provided between the substrate 1 and the first layer 31a. The first layer 31a includes a metal, for example, Ni. The second layer 31b includes, for example, any one of Ti, Cr, and W. The second layer 31b is, for example, an adhesive layer for improving the adhesiveness of the substrate 1 and the first layer 31a. The first layer 31a is a stress load layer. In a case where adhesiveness of the substrate 1 and the first layer 31a improves, "peeling resistance" of the first layer 31a improves. The first layer 31a is stable on the substrate 1. According to the first variation, an effect can be further obtained where, for example, "warping" and "breaking" of the first semiconductor chip 100 can be suppressed.

In a case where the first film 31 includes two layers, the first film 31 includes at least one stacked structure selected from the group consisting of, for example:
(s) layer including any one of Ti, Cr, and W/layer including Ni
(t) layer including any one of Ti, Cr, and W/layer including Cu.

For the stacked structure (s), the second layer 31*b* includes any one of Ti, Cr, and W, and the first layer 31*a* includes Ni.

For the stacked structure (t), the second layer 31*b* includes any one of Ti, Cr, and W, and the first layer 31*a* includes Cu.

The first film 31 may also include three or more layers.

In the case shown in FIG. 5B, the first film 31 includes the first layer 31*a*, the second layer 31*b*, and a third layer 31*c*. The second layer 31*b* is provided between the substrate 1 and the first layer 31*a*. The first layer 31*a* is provided between the second layer 31*b* and the third layer 31*c*.

In the case shown in FIG. 5C, the first film 31 includes the first layer 31*a*, the second layer 31*b*, the third layer 31*c*, and a fourth layer 31*d*. The second layer 31*b* is provided between the substrate 1 and the first layer 31*a*. The first layer 31*a* is provided between the second layer 31*b* and the fourth layer 31*d*. The fourth layer 31*d* is provided between the first layer 31*a* and the third layer 31*c*.

In a case where the first film 31 includes three or more layers, the first film 31 includes at least one stacked structure selected from the group consisting of, for example:
(u) layer including Ti/layer including Ni/layer including Cu
(v) layer including Ti/layer including W/layer including Ti
(w) layer including Ti/layer including Ni/layer including Cu/layer including Ti.

For the stacked structure (u), the second layer 31*b* includes Ti, the first layer 31*a* includes Ni, and the third layer 31*c* includes Cu.

For the stacked structure (v), the second layer 31*b* includes Ti, the first layer 31*a* includes W, and the third layer 31*c* includes Ti.

For the stacked structure (w), the second layer 31*b* includes Ti, the first layer 31*a* includes Ni, the fourth layer 31*d* includes Cu, and the third layer 31*c* includes Ti.

For example, in the stacked structure (u) and the stacked structure (w), the first film 31 includes, for example, a layer including Ni, and a layer including Cu. Film stress of the layer including Ni is different to film stress of the layer including Cu. The first film 31 may also include a plurality of layers with different film stresses. In a case where the first film 31 includes a plurality of layers with different film stresses, for example, an advantage can be obtained where the degree of freedom in relation to adjustment of the film stress in the first film 31 increases.

The first film 31 in the stacked structures (s) to (w) includes a metal layer, but the first film 31 may also include an alloy layer, a metal compound layer (for example, metal oxide, metal nitride, and metal oxynitride or the like), and a non-metal layer (for example, silicon oxide, silicon nitride, and silicon oxynitride or the like). In particular, although not shown, the first film 31 may also include five or more layers.

Such a stacked structure for the first film 31 is applied to variations of the first embodiment, the second embodiment, and variations of the second embodiment, to be described later.

Figure 6:
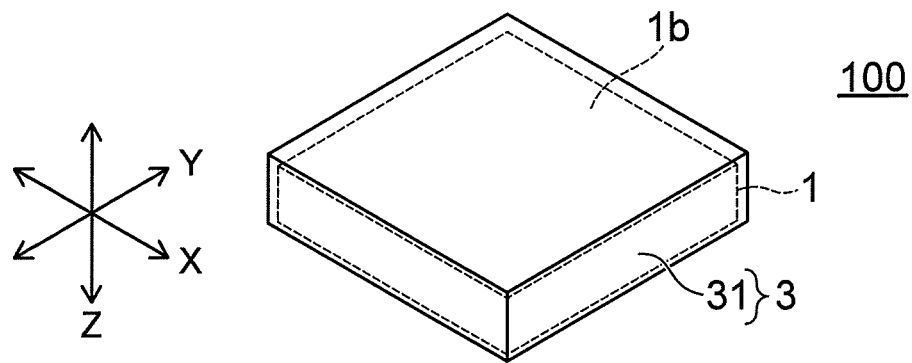
FIG. 6 is a schematic perspective view illustrating the semiconductor device according to the first embodiment.

FIG. 6 is a schematic perspective view illustrating the semiconductor device according to the first embodiment. Note that only the substrate 1 and the film 3 including the first film 31 are shown in FIG. 6.

As shown in FIG. 6, in the first semiconductor chip 100, the first film 31 is not patterned on the second surface 1*b* of the substrate 1. The first film 31 is provided, for example, on the entire surface of the second surface 1*b* of the substrate 1. The first film 31 may also be patterned on the second surface 1*b* of the substrate 1. The first film 31 may be cracked in one part, and may have one part removed on the second surface 1*b* of the substrate 1. In the following, a representative example of the first film 31 that has been patterned on the second surface 1*b* of the substrate 1 is illustrated as a second variation to a fourth variation.

Figure 7:
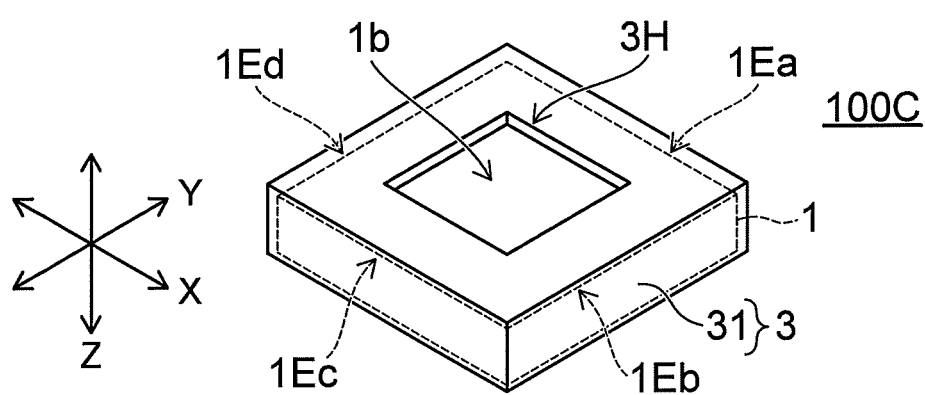
FIG. 7 is a schematic perspective view illustrating a semiconductor device according to a second variation of the first embodiment.

FIG. 7 is a schematic perspective view illustrating a semiconductor device according to a second variation of the first embodiment. Note that only the substrate 1 and the film 3 including the first film 31 are shown in FIG. 7.

As shown in FIG. 7, in a third semiconductor chip 100C of the semiconductor device according to the second variation, the first film 31 has a hole pattern 3H on the second surface 1*b* of the substrate 1. The hole pattern 3H, for example, is an isolated opening reaching from the surface of the first film 31 to the second surface 1*b* of the substrate 1. The first film 31 of the second semiconductor chip 100B is provided, for example, as one ring-shaped pattern on four edges 1Ea to 1Ed of the substrate 1, on the second surface 1*b* of the substrate 1.

The first film 31 may also have, for example, a hole pattern 3H on the second surface 1*b* of the substrate 1. The first film 31 may also have a plurality of hole patterns 3H.

Figure 8:
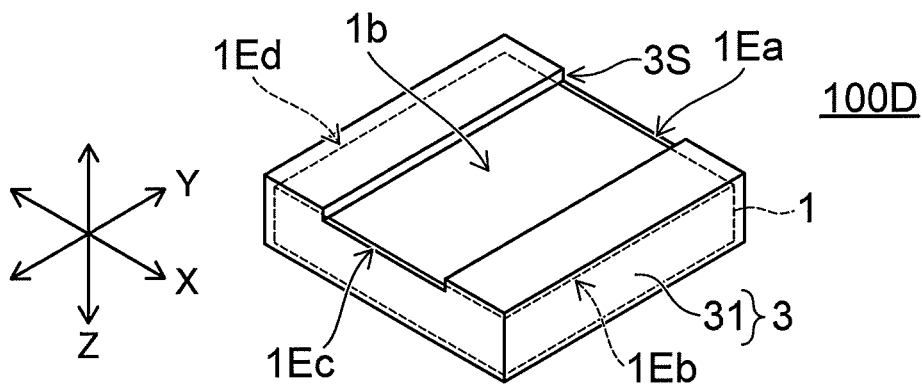
FIG. 8 is a schematic perspective view illustrating a semiconductor device according to a third variation of the first embodiment.

FIG. 8 is a schematic perspective view illustrating a semiconductor device according to a third variation of the first embodiment. Note that only the substrate 1 and the film 3 including the first film 31 are illustrated in FIG. 8.

As shown in FIG. 8, in a fourth semiconductor chip 100D of the semiconductor device according to the third variation, the first film 31 has a slit pattern 3S on the second surface 1*b* of the substrate 1. The slit pattern 3S is, for example, a line-shaped opening reaching from the surface of the first film 31 to the second surface 1*b* of the substrate 1. The slit pattern 3S is provided, for example, along the Y-axis direction, from an edge to another edge of the substrate 1. The first film 31 of the fourth semiconductor chip 100D is provided, for example, as two line-shaped patterns on the edge 1Eb of the substrate 1 and on the edge 1Ed of the substrate 1, on the second surface 1*b* of the substrate 1. The edge 1Eb of the substrate 1 faces the edge 1Ed of the substrate 1, in the substrate 1 which is a square shape.

The first film 31 may also have, for example, the slit pattern 3S on the second surface 1*b* of the substrate 1. The slit pattern 3S does not need to be provided from an edge to another edge of the substrate 1. For example, the slit pattern 3S may also be provided from on the second surface 1*b* of the substrate 1 to one edge of the substrate 1. The first film 31 may have a plurality of the slit patterns 3S. The first film 31 may also have the slit pattern 3S and the hole pattern 3H.

Figure 9:
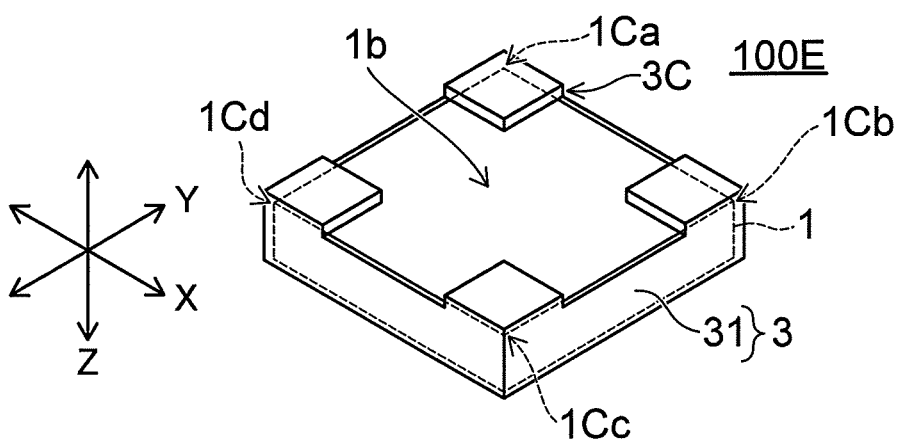
FIG. 9 is a schematic perspective view illustrating a semiconductor device according to a fourth variation of the first embodiment.

FIG. 9 is a schematic perspective view illustrating a semiconductor device according to a fourth variation of the first embodiment. Note that only the substrate 1 and the film 3 including the first film 31 are illustrated in FIG. 9.

As shown in FIG. 9, in a fifth semiconductor chip 100E of the semiconductor device according to the fourth variation, the first film 31 has a cross pattern 3C on the second surface 1*b* of the substrate 1. The cross pattern 3C is, for example, a cross-shaped opening reaching from the surface of the first film 31 to the second surface 1*b* of the substrate 1. The cross pattern 3C has a part provided along the Y-axis direction from an edge to another edge of the substrate 1, and has a part provided along the X-axis direction from an edge to another edge of the substrate 1. The first film 31 of the fifth semiconductor chip 100E is provided, for example, as four isolated patterns on four corners 1Ca to 1Cd of the substrate 1, on the second surface 1b of the substrate 1.

The first film 31 may also have, for example, the cross pattern 3C on the second surface 1b of the substrate 1. The cross pattern 3C does not need to be provided from an edge to another edge of the substrate 1. For example, the cross pattern 3C may also be provided as an isolated cross-shaped opening on the second surface 1b of the substrate 1. The first film 31 is not limited to one cross pattern 3C, but may also have a plurality of such. The first film 31 may also have the cross pattern 3C and the hole pattern 3H. The first film 31 may also have the cross pattern 3C and the slit pattern 3S. The first film 31 may also have the cross pattern 3C, the hole pattern 3H, and the slit pattern 3S.

Additionally, the first film 31 may also have an "opening" with a different pattern to the hole pattern 3H, the slit pattern 3S, and the cross pattern 3C, on the second surface 1b of the substrate 1.

Figure 10:
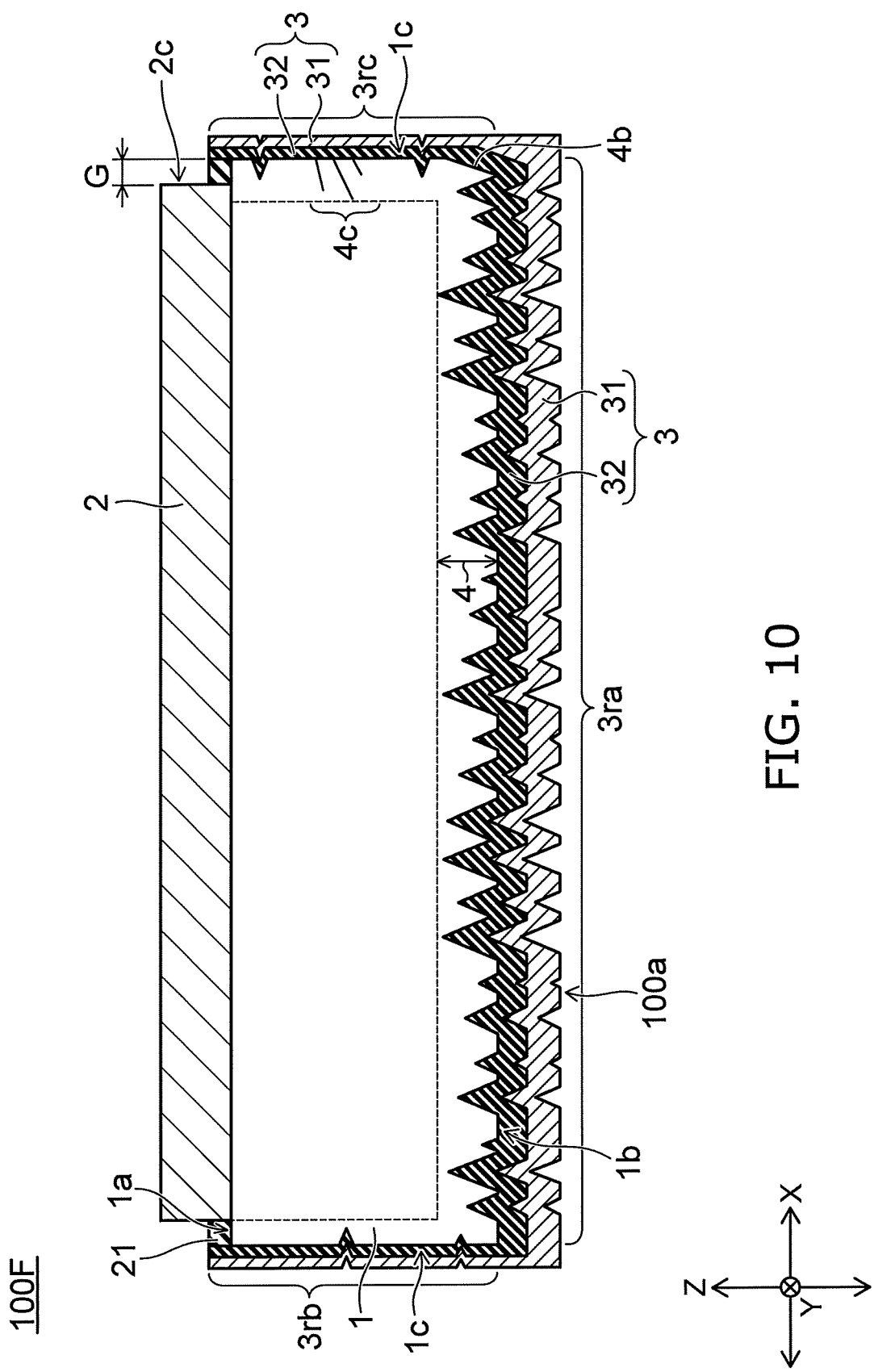
FIG. 10 is a schematic cross-sectional view illustrating a semiconductor device according to a fifth variation of the first embodiment.

FIG. 10 is a schematic cross-sectional view illustrating a semiconductor device according to a fifth variation of the first embodiment.

As shown in FIG. 10, in a sixth semiconductor chip 100F of the semiconductor device according to the fifth variation, the film 3 includes the first film 31 and a second film 32. The second film 32 is provided between the substrate 1 and the first film 31.

The first film 31 of the sixth semiconductor chip 100F includes, for example, a metal. In the fifth variation, the first film 31 includes, for example, Ni. The first film 31 is, for example, a stress load layer. The second film 32 includes, for example, a metal different to the first film 31, or a non-metal. In the fifth variation, the second film 32 includes, for example, silicon oxide.

In the fifth variation, the function of the second film 32 includes at least one of the following, for example:
  suppressing diffusion of ions from the first film 31 to the substrate 1 (for example, a barrier layer)
  improving adhesiveness of the first film 31 and the substrate 1 (for example, an adhesive layer)
  insulating the first film 31 and the substrate 1 (for example, an insulating layer).

According to the fifth variation, at least one of the following advantages can be further obtained, for example:
  diffusion of ions from the first film 31 to the substrate 1 can be suppressed
  adhesiveness of the first film 31 and the substrate 1 can be improved
  the first film 31 can be electrically insulated from the substrate 1.

In a case where diffusion of ions from the first film 31 to the substrate 1 can be suppressed, for example, reliability of the semiconductor device improves.

In a case where adhesiveness of the first film 31 and the substrate 1 improves, for example, an effect can be further obtained where, for example, "warping" and "breaking" of the sixth semiconductor chip 100F can be suppressed.

In a case where the first film 31 can be electrically insulated from the substrate 1, for example, reliability of the semiconductor device improves.

For example, in the fifth variation, the second film 32 includes, for example, silicon oxide. In this case, the second film 32 functions as a barrier layer for suppressing diffusion of ions from the first film 31 including, for example, Ni to the substrate 1.

Figure 11:
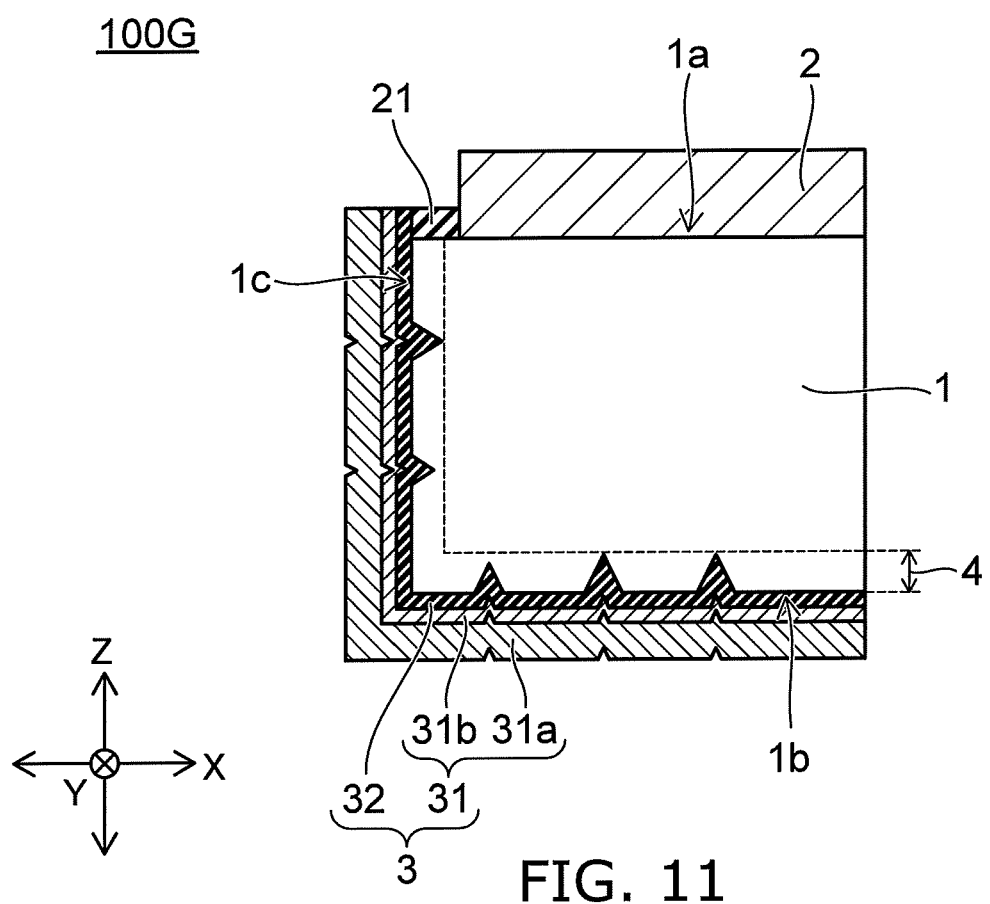
FIG. 11 is a schematic cross-sectional view illustrating a semiconductor device according to a sixth variation of the first embodiment.

FIG. 11 is a schematic cross-sectional view illustrating a semiconductor device according to a sixth variation of the first embodiment. As shown in FIG. 11, in a seventh semiconductor chip 100G of the semiconductor device according to the sixth variation, the film 3 includes the first film 31 and the second film 32. The second film 32 is provided between the substrate 1 and the first film 31. The first film 31 includes the first layer 31a and the second layer 31b. The second layer 31b is provided between the first film 31 and the first layer 31a.

The first layer 31a of the seventh semiconductor chip 100G includes, for example, a metal. In the sixth variation, the first layer 31a includes, for example, Ni. The first layer 31a is, for example, a stress load layer. The second layer 31b includes, for example, a metal different to the first layer 31a, or a non-metal. In the sixth variation, the second layer 31b includes, for example, Ti. The second film 32 includes, for example, a metal different to the first layer 31a and the first layer 31a, or a non-metal. In the sixth variation, the second film 32 includes, for example, silicon oxide.

In the sixth variation, the function of the second layer 31b includes at least one of the following, for example:
  improving the adhesiveness of the first layer 31a and the second film 32 (for example, an adhesive layer)
  suppressing the diffusion of ions from the first layer 31a to the second film 32 (for example, a barrier layer)
  insulating the first layer 31a and the second film 32 (for example, an insulating layer).

According to the sixth variation, at least one of the following advantages can be further obtained, for example:
  adhesiveness of the first layer 31a and the second film 32 improves
  diffusion of ions from the first layer 31a to the second film 32 can be suppressed
  the first layer 31a can be electrically insulated from the second film 32. For example, in the sixth variation, the second layer 31b includes, for example, any one of Ti, Cri, and W. In this case, the second layer 31b functions as an adhesive layer for improving adhesiveness of the first layer 31a including, for example, Ni and the second film 32.

As in the sixth variation, the fifth variation can also be combined with the first variation. A case where the first film 31 includes two layers is illustrated in the sixth variation, however, the first film 31 may also include three or more layers.

Figure 12:
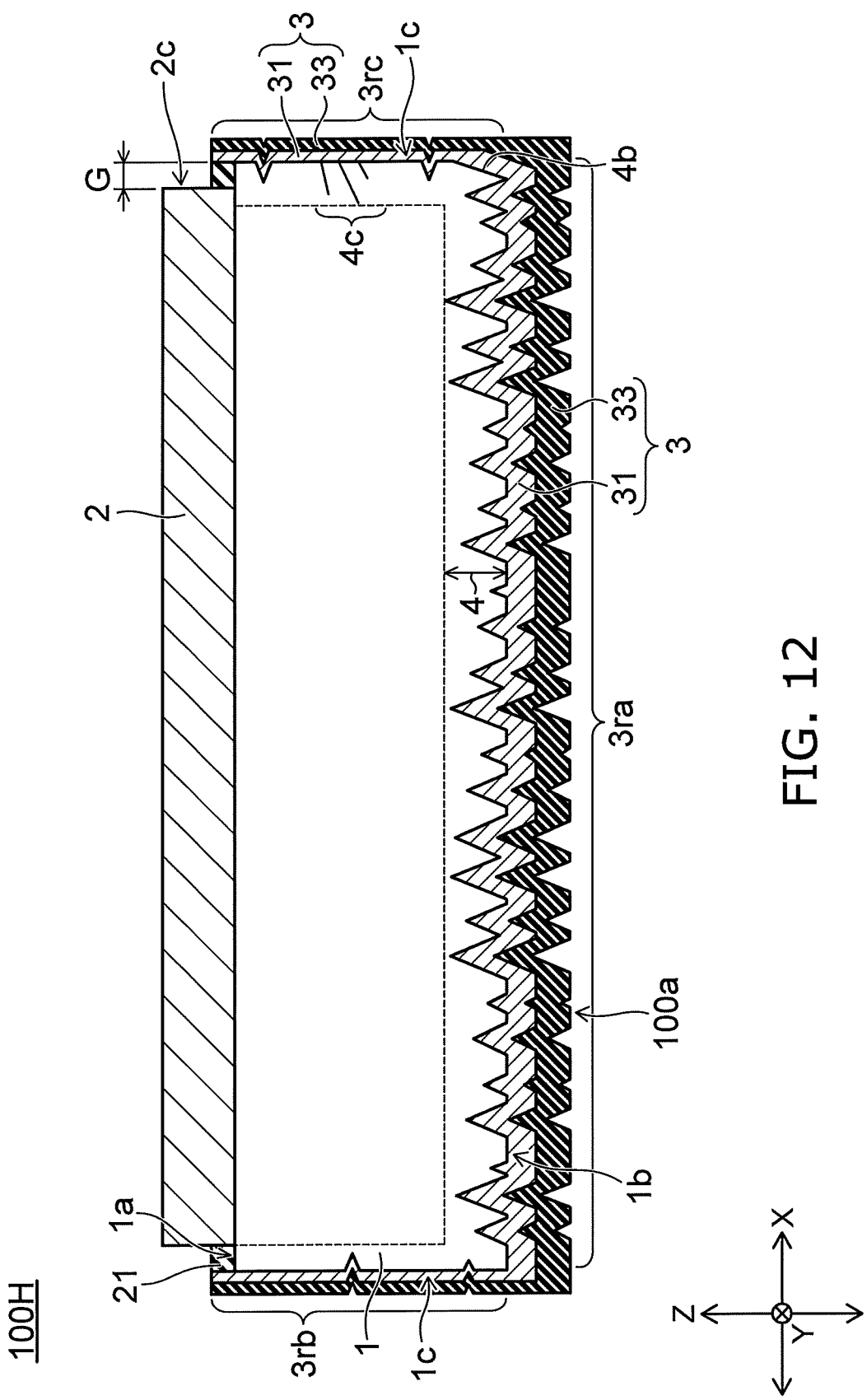
FIG. 12 is a schematic cross-sectional view illustrating a semiconductor device according to a seventh variation of the first embodiment.

FIG. 12 is a schematic cross-sectional view illustrating a semiconductor device according to a seventh variation of the first embodiment. As shown in FIG. 12, in an eighth semiconductor chip 100H of the semiconductor device according to the seventh variation, the film 3 includes the first film 31 and a third film 33. The first film 31 is provided between the substrate 1 and the third film 33.

The first film 31 of the eighth semiconductor chip 100H includes, for example, a metal. In the seventh variation, the first film 31 includes, for example, Ni. The first film 31 is, for example, a stress load layer. The third film 33 includes, for example, a metal different to the first film 31, or a non-metal. In the seventh variation, the third film 33 includes, for example, silicon oxide.

Figure 13:
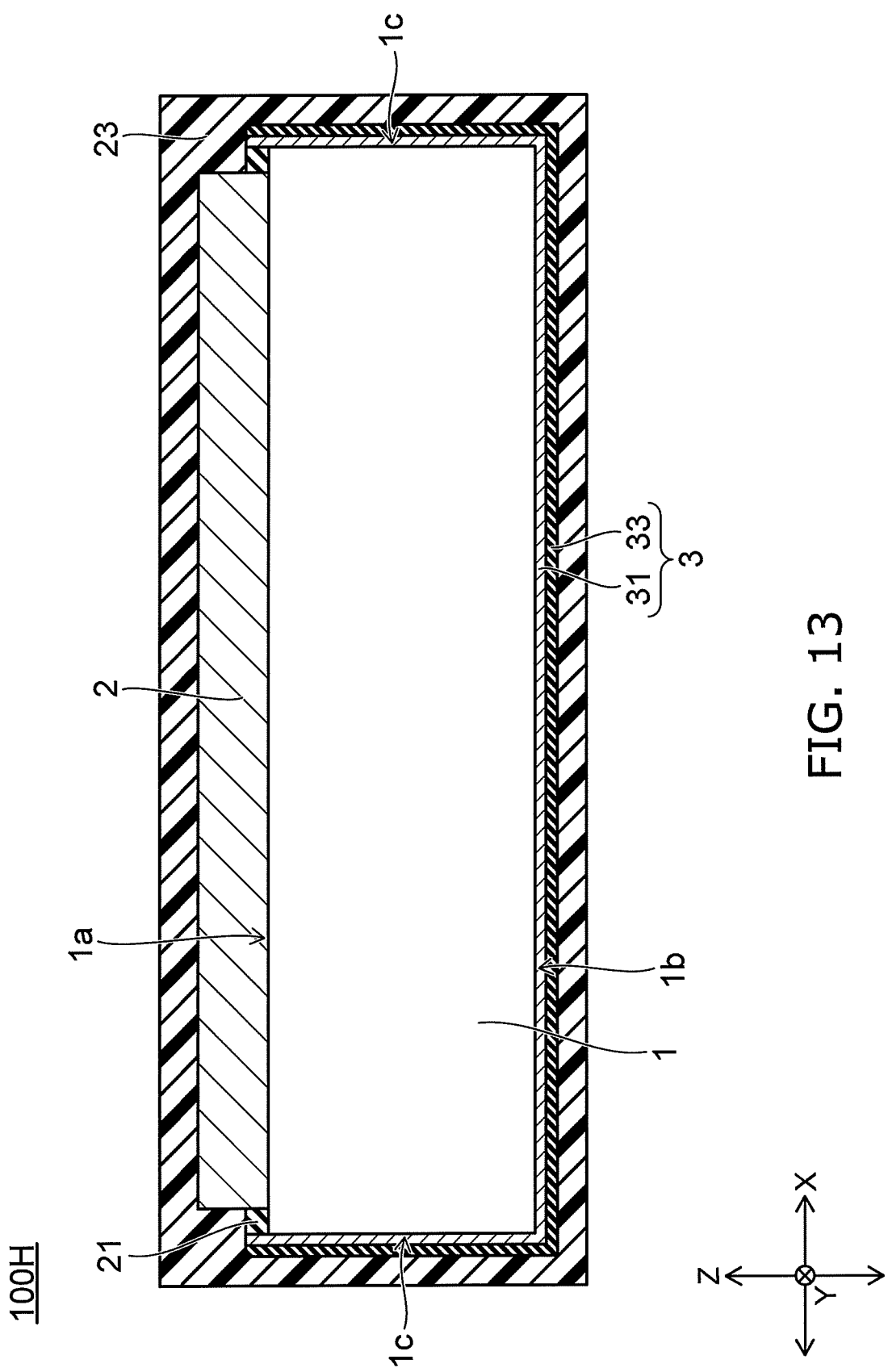
FIG. 13 is a schematic cross-sectional view illustrating a mold material.

FIG. 13 is a schematic cross-sectional view illustrating a mold material. Note that an illustration for the minute unevenness 4 is omitted in FIG. 13.

The semiconductor device has, for example, a mold material. The mold material covers a semiconductor chip.

For example, a state wherein the eighth semiconductor chip 100H is covered by a mold material 23 is shown in FIG. 13. The mold material 23 includes, for example, a resin.

In the seventh variation, the function of the third film 33 includes at least one of the following, for example:

suppressing the diffusion of ions from the first film 31 to the mold material 23 (for example, a barrier layer)

insulating the first film 31 and the mold material 23 (for example, an insulating layer)

improving the adhesiveness of the first film 31 and the mold material 23 (for example, an adhesive layer).

According to the seventh variation, at least one of the following advantages can be further obtained, for example:

diffusion of ions from the first film 31 to the mold material 23 can be suppressed the first film 31 can be electrically insulated from the mold material 23 adhesiveness of the first film 31 and the mold material 23 improves.

In the case where diffusion of ions from the first film 31 to the mold material 23 can be suppressed, for example, reliability of the semiconductor device improves.

In the case where the first film 31 can be electrically insulated from the mold material 23, for example, reliability of the semiconductor device improves.

In the case where adhesiveness of the first film 31 and the mold material 23 improves, for example, reliability of the semiconductor device improves.

For example, in the seventh variation, the third film 33 includes, for example, silicon oxide. In this case, the third film 33 functions as a barrier layer for suppressing diffusion of ions from the first film 31 including, for example, Ni to the mold material 23.

In particular, although not shown, note that the seventh variation can also be combined with the first variation.

Figure 14:
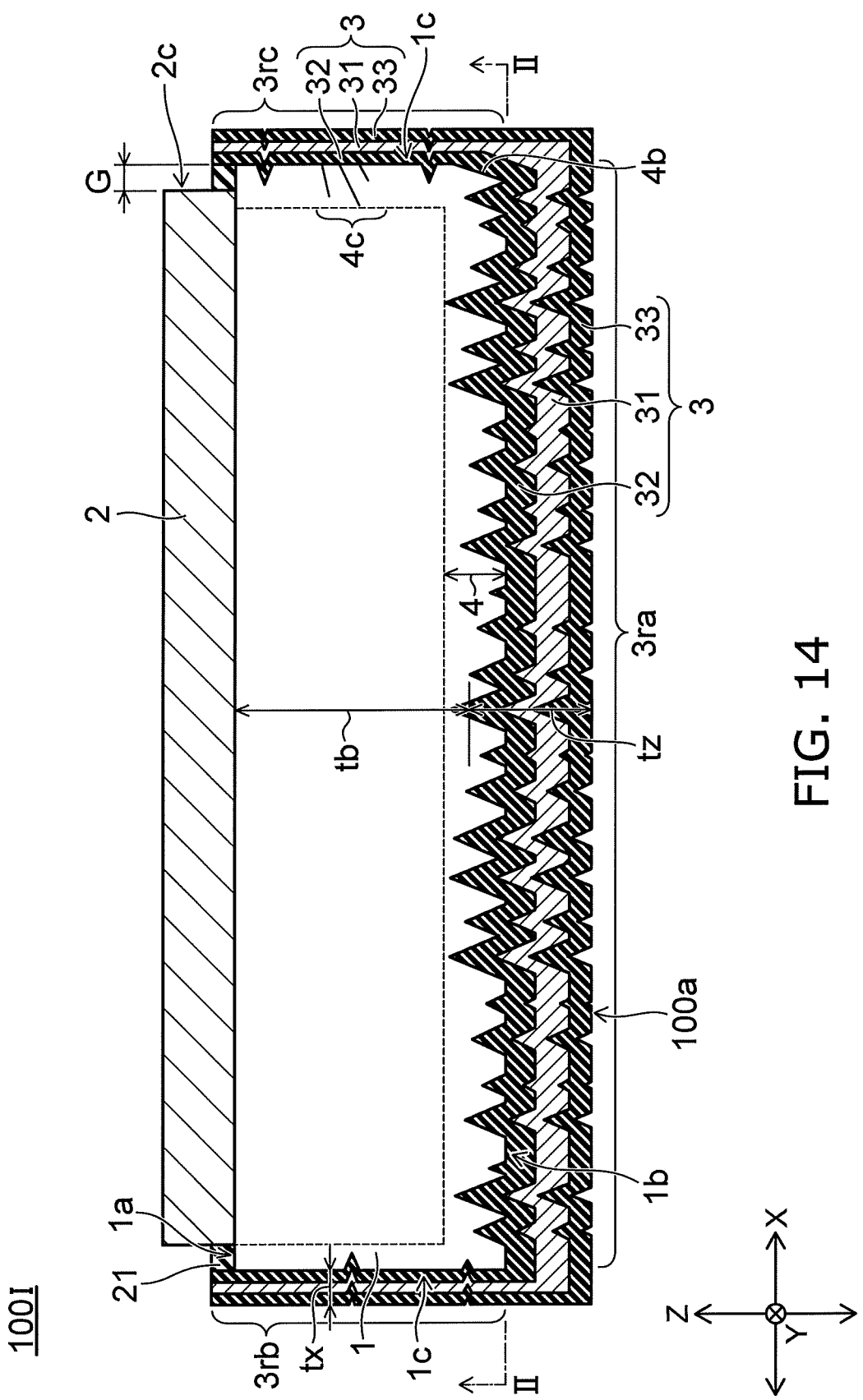
FIG. 14 is a schematic cross-sectional view illustrating a semiconductor device according to an eighth variation of the first embodiment.

FIG. 14 is a schematic cross-sectional view illustrating a semiconductor device according to an eighth variation of the first embodiment. As shown in FIG. 14, in a ninth semiconductor chip 100I of the semiconductor device according to the eighth variation, the film 3 includes the first film 31, the second film 32, and the third film 33. The second film 32 is provided between the substrate 1 and the first film 31. The first film 31 is provided between the second film 32 and the third film 33.

The first film 31 of the ninth semiconductor chip 100I includes, for example, a metal. In the eighth variation, the first film 31 includes, for example, Ni. The first film 31 is, for example, a stress load layer. The second film 32 includes, for example, a metal different to the first film 31, or a non-metal. In the eighth variation, the second film 32 includes, for example, silicon oxide. The third film 33 includes, for example, a metal different to the first film 31, or a non-metal. In the eighth variation, the third film 33 includes, for example, silicon oxide.

As in the eighth variation, the fifth variation can also be combined with the seventh variation. According to the eighth variation, for example, the advantages obtained from the fifth variation and the seventh variation can both be obtained.

In particular, although not shown, note that the eighth variation can also be combined with the first variation.

In the fifth to the eighth variations, the second film 32 and third film 33 each include, for example, at least one selected from the group consisting of the aforementioned non-metals (n) to (q). The non-metals (n) to (q) are merely examples. Non-metals other than the foregoing may also be selected. Additionally, a metal compound with insulation properties, for example, alumina or the like, may also be selected for the second film 32 and third film 33. The material of the second film 32 and the material of the third film 33 are applied to the variations of the first embodiment, the second embodiment, and the variations of the second embodiment, to be described later.

Figure 15:
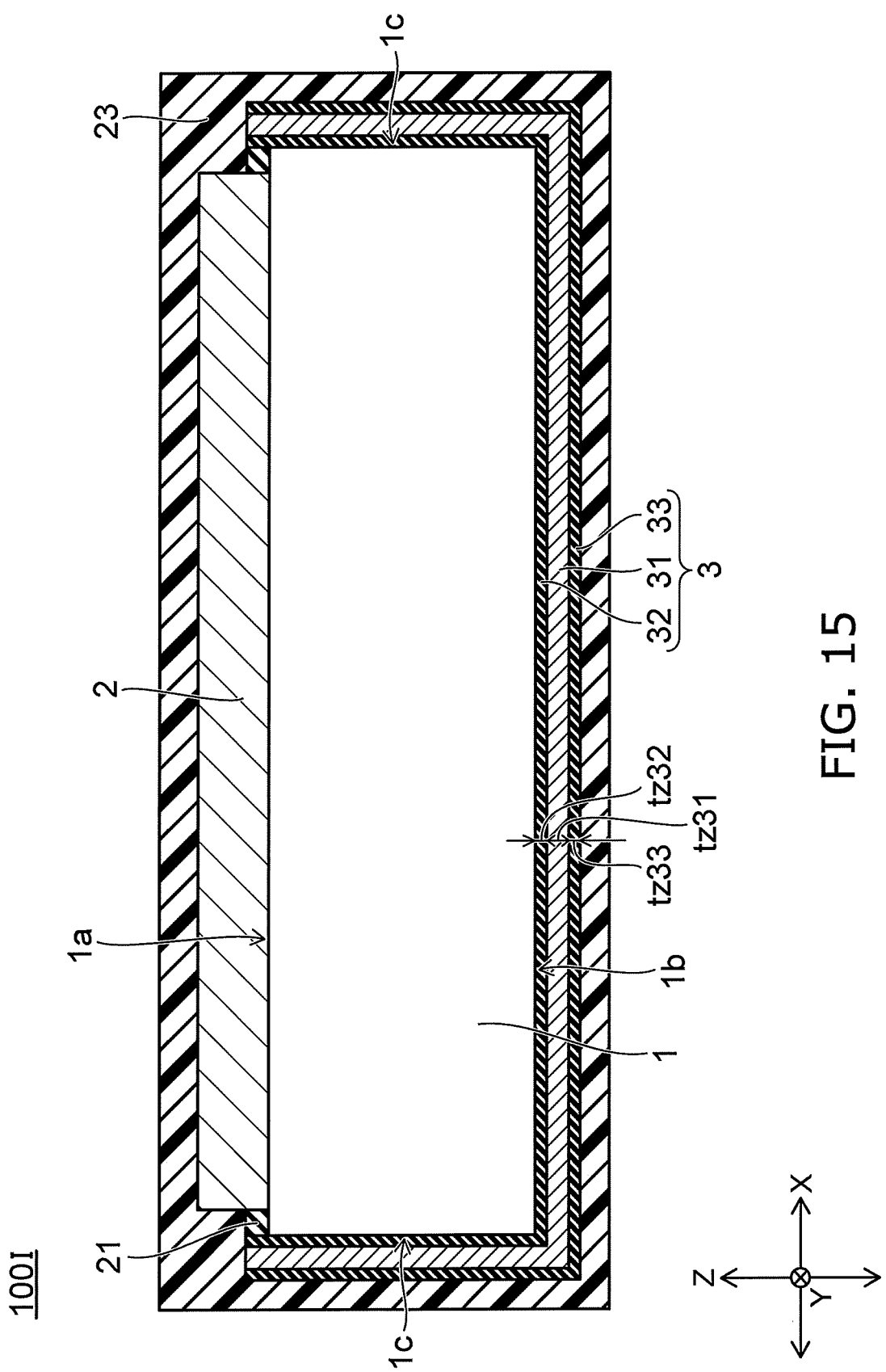
FIG. 15 is a schematic cross-sectional view showing a thickness of the film.

FIG. 15 is a schematic cross-sectional view showing the thickness of the film 3. Note that an illustration for the minute unevenness 4 is omitted in FIG. 15.

The function and one object of the first film 31 are, for example, to mitigate the force of the device layer 2 that attempts to deform the substrate 1. The function and one object of the second film 32 are, for example, to suppress diffusion of ions from the first film 31 to the substrate 1. The function and one object of the third film 33 are, for example, to suppress diffusion of ions from the first film 31 to the mold material 23.

In order to achieve these functions and objects, a thickness $tz31$ in the Z-axis direction of the first film 31 is set to, for example, from 0.5 to 5.0 μm, as shown in FIG. 15. By doing so, for example, "warping" and "breaking" of the substrate 1 can be suppressed. A thickness $t32$ in the Z-axis direction of the second film 32 is set to, for example, from appropriately 0.1 to 0.5 μm. In doing so, for example, diffusion of ions from the first film 31 to the substrate 1 can be suppressed. A thickness $t33$ in the Z-axis direction of the third film 33 is set to, for example, appropriately from 0.1 to 0.5 μm. By doing so, for example, diffusion of ions from the first film 31 to the mold material 23 can be suppressed.

In the film 3, one relationship between the thickness $tz31$ in the Z-axis direction of the first film 31 and the thickness $tz32$ in the Z-axis direction of the second film 32 is, for example, set to: $tz31>tz32$. For example, the thickness $tz32$ in the Z-axis direction of the second film 32 is set to approximately 1/50 to 1 (=(0.1/5.0) to (0.5/0.5)) of the thickness $tz31$ in the Z-axis direction of the first film 31.

In the film 3, one relationship between the thickness $tz31$ in the Z-axis direction of the first film 31 and the thickness $tz32$ in the Z-axis direction of the third film 33 is, for example, set to: $tz31>tz33$. For example, the thickness $tz33$ in the Z-axis direction of the third film 33 is set to approximately 1/50 to 1 (=(0.1/5.0) to (0.5/0.5)) of the thickness $tz31$ in the Z-axis direction of the first film 31.

By leveling the thickness $tz32$ in the Z-axis direction of the second film 32 and the thickness $tz33$ in the Z-axis direction of the third film 33 to a thinness wherein the functions can be exhibited, the semiconductor chip, for example, the thickness in the Z-axis direction of the ninth semiconductor chip 100I shown in FIG. 15 can be even slightly thinned. Being able to thin the thickness in the Z-axis direction of the ninth semiconductor chip 100I is, for example, a valid advantage in the semiconductor device wherein the ninth semiconductor chip 100I is stacked along the Z-axis direction.

The measurement location of the thickness $tz31$, thickness $tz32$, and thickness $tz33$ should be, for example, the center cross-section of the substrate 1, as aforementioned. The measurement method should be, for example, a calculation from a cross-sectional observation image by SEM or TEM, as aforementioned.

Figures 16, 17:
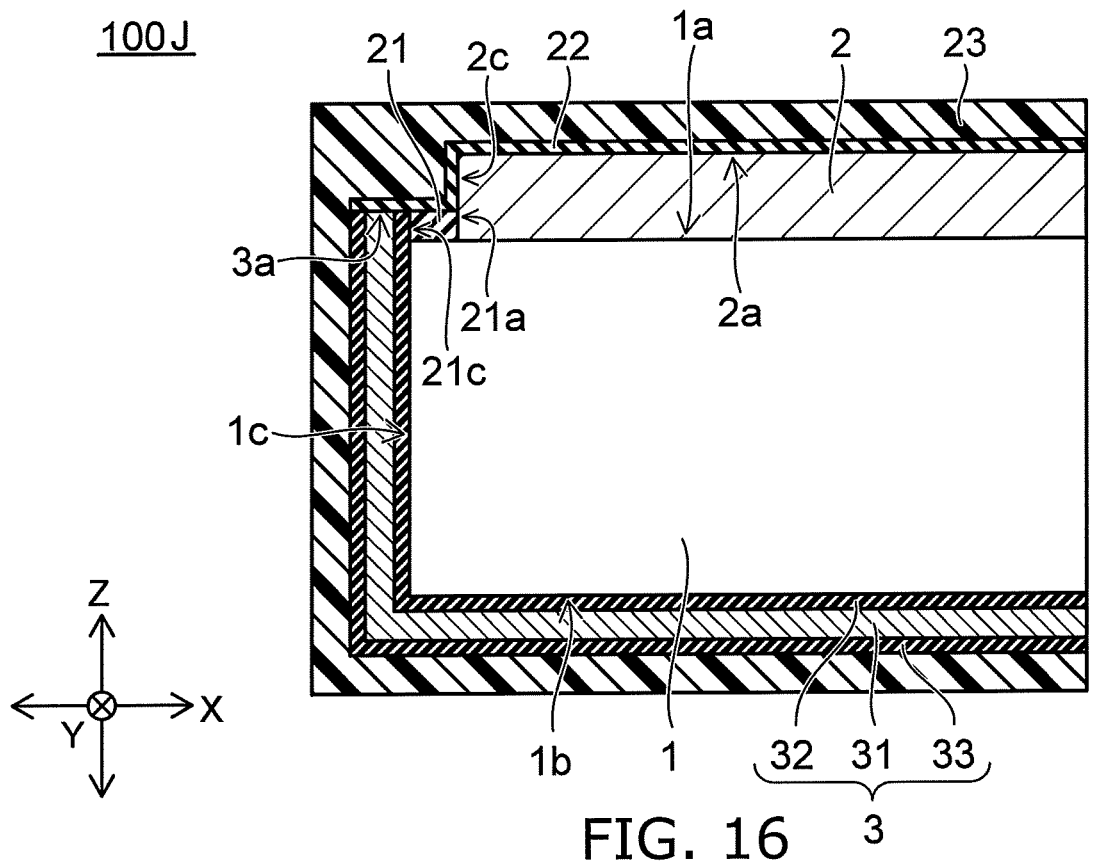
FIG. 16 is a schematic cross-sectional view illustrating a semiconductor device according to a ninth variation of the first embodiment.
FIG. 17 is a schematic cross-sectional view illustrating a semiconductor device according to a tenth variation of the first embodiment.

FIG. 16 is a schematic cross-sectional view illustrating a semiconductor device according to a ninth variation of the first embodiment. An upper surface 3a of the film 3 is shown in FIG. 16. Note that an illustration for the minute unevenness 4 is omitted in FIG. 16.

In a case where the first film 31 includes, for example, a metal, there is a possibility that ions will be diffused from the first film 31 to the mold material 23 on the upper surface 3a of the film 3. Such diffusion of ions can be suppressed by providing, for example, an insulation film 22 on the upper surface 3a of the film 3, as in a tenth semiconductor chip 1003 shown in FIG. 16. The insulation film 22 is provided, for example, on the upper surface 3a of the film 3, on an upper surface 21a of the structure 21, on the side surface 21c of the structure 21, on an upper surface 2a of the device layer 2, and on the side surface 2c of the device layer 2. The insulation film 22 includes, for example, a resin with insulation properties. The resin with insulation properties is, for example, polyimide or the like.

FIG. 17 is a schematic cross-sectional view illustrating a semiconductor device according to a tenth variation of the first embodiment. Note that an illustration for the minute unevenness 4 is omitted in FIG. 17.

As shown in FIG. 17, in an eleventh semiconductor chip 100K of the semiconductor device according to the tenth variation, the film 3 includes the first film 31, the second film 32, and the third film 33. The first film 3 includes, for example, a metal, for example, Ni. The second film 32 and the third film 33 include, for example, silicon oxide. On the side surface 1c of the substrate 1, the thickness tx in the X-axis direction of the film 3 is made thinner toward the first surface 1a of the substrate 1. For example, the cross-sectional shape of the film 3 in the tenth variation has, for example, a "tapered shape" becoming thinner from the second surface 1b of the substrate 1 toward the first surface 1a of the substrate 1, on the side surface 1c of the substrate 1. The thickness tx31 in the X-axis direction of the first film 31, the thickness tx32 in the X-axis direction of the second film 32, and the thickness tx33 in the X-axis direction of the third film 33 are also each thinned toward the first surface 1a of the substrate 1. For example, on the side surface 1c of the substrate 1, the first film 31 is coated by the third film 33. The thickness tz in the X-axis direction of the film 3 becomes, for example, "0", on, for example, the first surface 1a of the substrate 1, or near the first surface 1a.

In the eleventh semiconductor chip 100K of the tenth variation, the third film 33 covers the first film 31 on the side surface 1c of the substrate 1. According to the tenth variation, diffusion of ions from the first film 31 to the mold material 23 can be suppressed.

Figure 18:
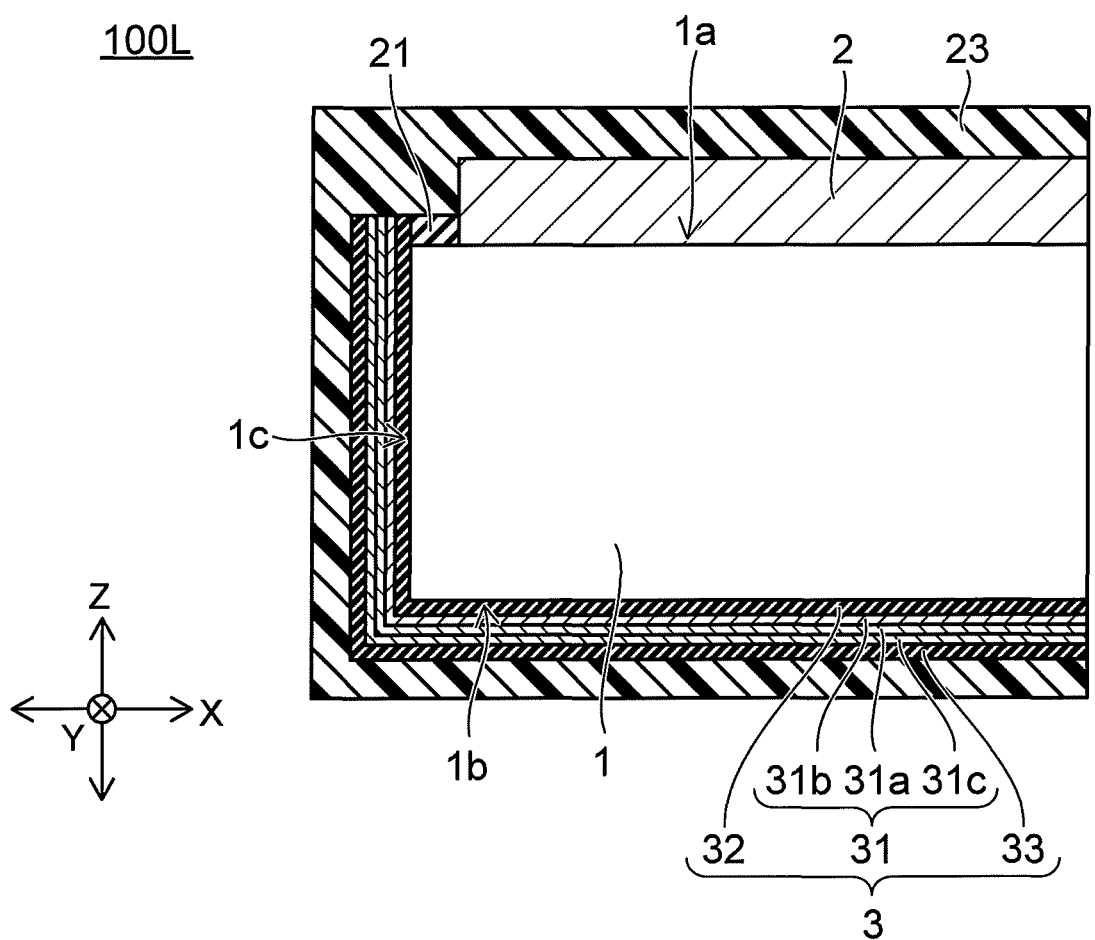
FIG. 18 is a schematic cross-sectional view illustrating a semiconductor device according to an eleventh variation of the first embodiment.

FIG. 18 is a schematic cross-sectional view illustrating a semiconductor device according to an eleventh variation of the first embodiment. Note that an illustration for the minute unevenness 4 is omitted in FIG. 18.

As shown in FIG. 18, in a twelfth semiconductor chip 100L of the semiconductor device according to the eleventh variation, the film 3 includes the first film 31, the second film 32, and the third film 33. Furthermore, the first film 31 includes the first layer 31a, the second layer 31b, and the third layer 31c. The second layer 31b is provided between the first layer 31a and the second film 32. The first layer 31a is provided between the second layer 31b and the third layer 31c. The third layer 31c is provided between the first layer 31a and the third film 33.

The eleventh variation is a combination, for example, of when the first film 31 of the first variation of the first embodiment includes three or more layers and the eighth variation of the first embodiment.

According to the eleventh variation, at least one of the following advantages can be further obtained, for example:

adhesiveness of the first layer 31a and the second film 32 can be improved diffusion of ions from the first layer 31a to the second film 32 can be suppressed the first layer 31a can be electrically insulated from the second film 32 adhesiveness of the first layer 31a and the third film 33 can be improved diffusion of ions from the first layer 31a to the third film 33 can be suppressed the first layer 31a can be electrically insulated from the third film 33.

In the eleventh variation, the second film 32 includes, for example, silicon oxide. The second layer 31b includes, for example, any one of Ti, Cr, and W. The first layer 31a includes, for example, Ni. The third layer 31c includes, for example, any one of Ti, Cr, and W. The third film 33 includes, for example, silicon oxide. The second film 32 and the third film 33 including silicon oxide function as barrier layers. The second layer 31b and the third layer 31c including Ti function as adhesive layers. The first layer 31a including Ni functions as a stress load layer.

For example, according to the twelfth semiconductor chip 100L, provided with the film 3 including a "barrier layer/adhesive layer/stress load layer/adhesive layer/barrier layer", diffusion of ions from the first layer 31a to the substrate 1 and the mold material 23 can be suppressed. Furthermore, adhesiveness of the first layer 31a and the second film 32 and adhesiveness of the first layer 31a and the third film 33 can both be improved. "Peeling resistance" of the first layer 31a further improves. According to the twelfth semiconductor chip 100L wherein peeling resistance of the first layer 31a further improves, diffusion of ions is further suppressed, and reliability of the semiconductor device further improves. Moreover, the twelfth semiconductor chip 100K is less likely to experience "warping", and also less likely to experience "breaking".

Second Embodiment

Figure 19:
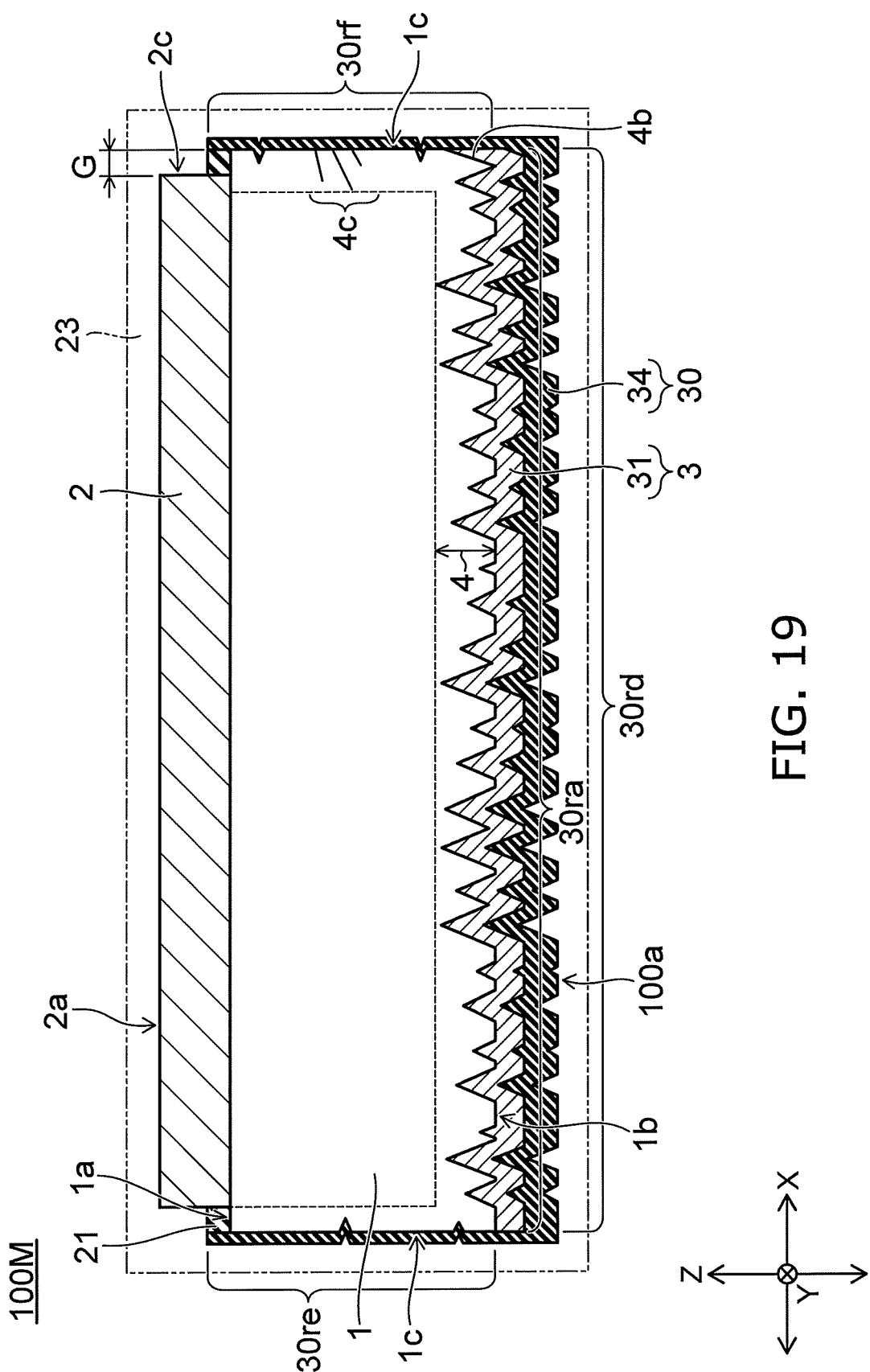
FIG. 19 is a schematic cross-sectional view illustrating a semiconductor device according to a second embodiment.

FIG. 19 is a schematic cross-sectional view illustrating a semiconductor device according to a second embodiment. The cross-section shown in FIG. 19, for example, corresponds to the cross section shown in FIG. 1.

As shown in FIG. 19, the second embodiment includes the substrate 1, the device layer 2, and the film 3 including the first film 31, the same as the first embodiment. The second embodiment further includes a film 30 including a fourth film 34.

In the second embodiment, the film 3 includes the first region 3ra. The substrate 1 is positioned between the first region 3ra and the device layer 2 in the Z-axis direction. The film 3 is provided, for example, on the second surface 1b of the substrate 1.

The film 30 includes a fourth region 30rd, a fifth region 30re, and a sixth region 30rf. The substrate 1 and the film 3 are positioned between the fourth region 30rd and the device layer 2 in the Z-axis direction. The substrate 1 is positioned between the fifth region 30re and the sixth region 30rf in the X-axis direction. In the second embodiment, the film 30 covers, for example, the film 3 and the side surface 1c of the substrate 1. In the second embodiment, the film 30 is, for example, one film provided continuously from above the film 3 to above the side surface 1c of the substrate 1. The one film is, for example, a film with an integral structure.

The gap G is also provided between the side surface 1c of the substrate 1 and the side surface 2c of the device layer 2 in the second embodiment, the same as the first embodiment. The film 30 is separated from the device layer 2. The film 30 is provided on the side surface 1c of the substrate 1, however, for example, it is not provided on the first surface 1a in gap G and on the device layer 2.

In a thirteenth semiconductor chip 100M of the second embodiment, the film 3 and the side surface 1c of the substrate 1 is covered by the film 30. The first film 31 of film 3 of the thirteenth semiconductor chip 100M includes, for example, a metal. In the second embodiment, the first film 31 includes, for example, Ni. The first film 31 is, for example, a stress load layer. In the second embodiment, the fourth film 34 of the film 30 includes, for example, silicon oxide.

In the second embodiment, the function of the fourth film 34 includes at least one of the following, for example:

suppressing infiltration of impurities or ions into the substrate 1 from the side surface 1c of the substrate 1 suppressing a decrease in strength of the substrate 1, caused by a surface roughness 4 of the side surface is of the substrate 1 improving peeling resistance from the substrate 1 of the film 3 suppressing diffusion of ions from the film 3 to the mold material 23.

According to the second embodiment, the film 3 including the first film 31 (stress load layer) is provided on the second surface 1b of the substrate 1. According to the second embodiment, for example, "warping" of the thirteenth semiconductor chip 100M can be suppressed.

Furthermore, according to the second embodiment, the film 30 including the fourth film 34 is provided. According to the second embodiment, at least one of the following advantages can be further obtained, for example:

infiltration of impurities or ions from the side surface 1c of the substrate 1 into the substrate 1 can be suppressed strength of the substrate 1 further improves peeling resistance from the substrate 1 of the film 3 improves diffusion of ions from the film 3 to the mold material 23 can be suppressed.

In a case where infiltration of impurities or ions from the side surface 1c of the substrate 1 into the substrate 1 can be suppressed, for example, reliability of the semiconductor device improves.

In a case where the strength of the substrate 1 further improves, for example, "breaking" of the thirteenth semiconductor chip 100M can be further suppressed well. In particular, the thirteenth semiconductor chip 100M becomes even less likely to be damaged in the pick-up process and mounting process or the like.

In a case where peeling resistance from the substrate 1 of the film 3 improves, for example, the film 3 is stable on the substrate 1. By the film 3 being stable on the substrate 1, the thirteenth semiconductor chip 100M can further obtain an effect where, for example, "warping" and "breaking" can be suppressed.

In a case where diffusion of ions from the film 3 to the mold material can be suppressed, for example, reliability of the semiconductor device improves.

In the second embodiment, the materials described in the first embodiment can be used in the first film 31 of the film 3. The material of the first film 31 is applied even to the variations of the second embodiment to be described later.

In the second embodiment, a material the same as the material of the second film 32 of the first embodiment, for example, can be selected for the film of the fourth film 34 of the film 30. The material of the fourth film 34 is applied even to the variations of the second embodiment to be described later.

Figure 20:
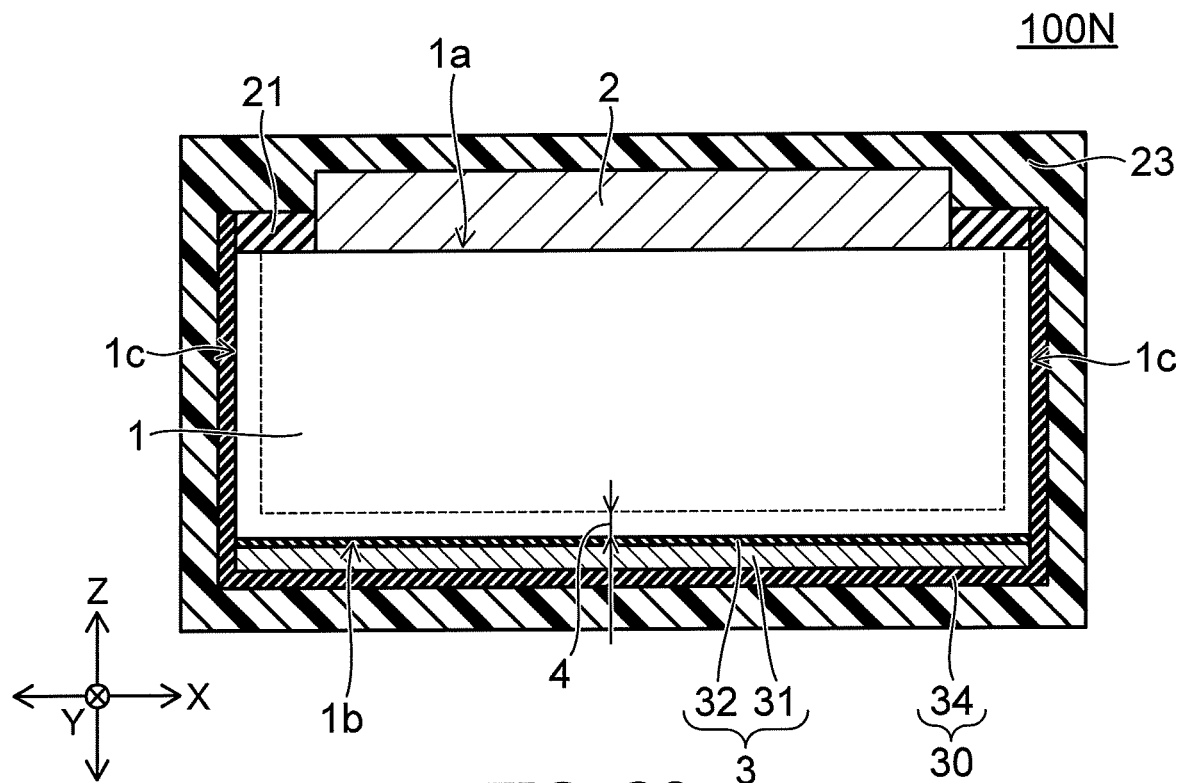
FIG. 20 is a schematic cross-sectional view illustrating a semiconductor device according to a first variation of the second embodiment.

FIG. 20 is a schematic cross-sectional view illustrating a semiconductor device according to a first variation of the second embodiment. Note that the minute unevenness 4 is shown in FIG. 20, omitting the unevenness.

As shown in FIG. 20, in a fourteenth semiconductor chip 100N of the semiconductor device according to the first variation of the second embodiment, the film 3 includes the first film 31 and the second film 32. The second film 32 is provided between the substrate 1 and the first film 31.

As in the first variation of the second embodiment, the second embodiment can be combined with the fifth variation of the first embodiment. In particular, although not shown, note that the second embodiment can be combined with the sixth variation of the first embodiment, and also with the seventh variation of the first embodiment.

Figure 21:
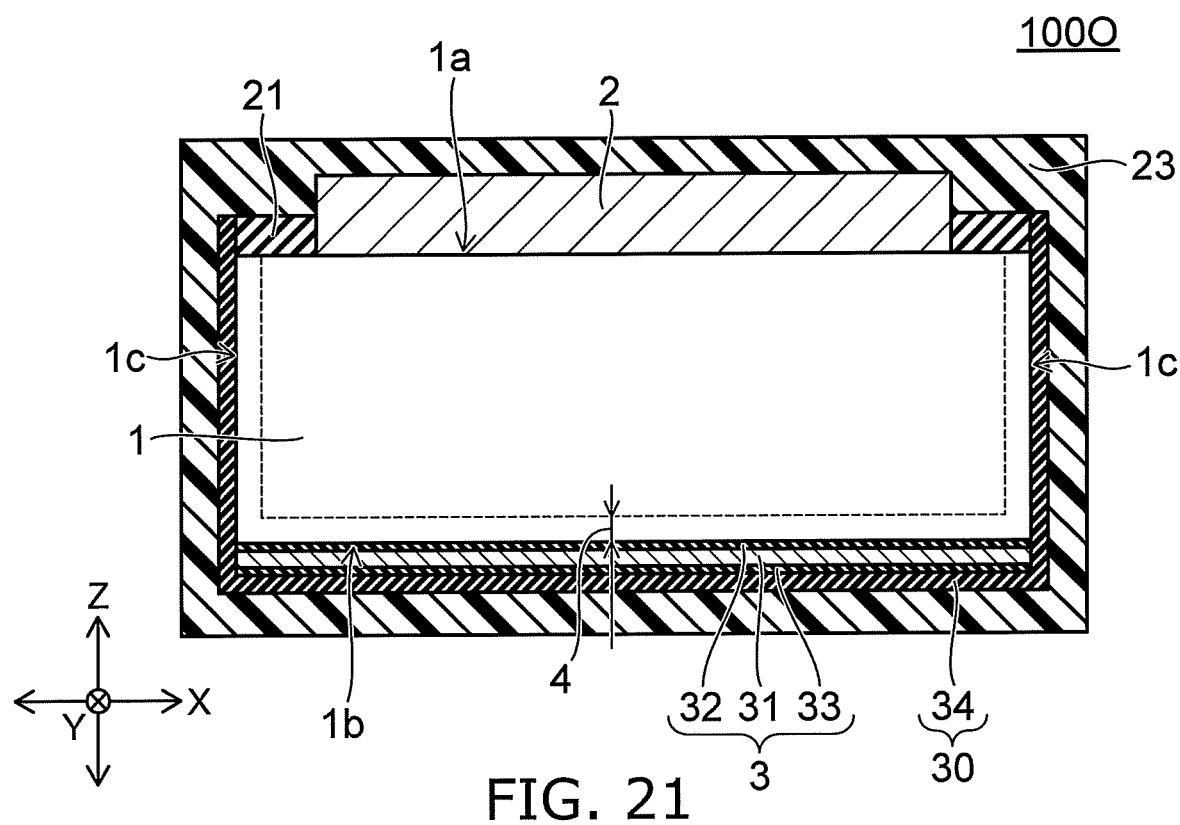
FIG. 21 is a schematic cross-sectional view illustrating a semiconductor device according to a second variation of the second embodiment.

FIG. 21 is a schematic cross-sectional view illustrating a semiconductor device according to a second variation of the second embodiment. Note that the minute unevenness 4 is shown in FIG. 21, omitting the unevenness.

As shown in FIG. 21, in a fifteenth semiconductor chip 100O of the semiconductor device according to the second variation of the second embodiment, the film 3 includes the first film 31, the second film 32, and the third film 33. The second film 32 is provided between the substrate 1 and the first film 31. The first film 31 is provided between the second film 32 and the third film 33.

As in the first variation of the second embodiment, the second embodiment can be combined with the eighth variation of the first embodiment.

Figure 22:
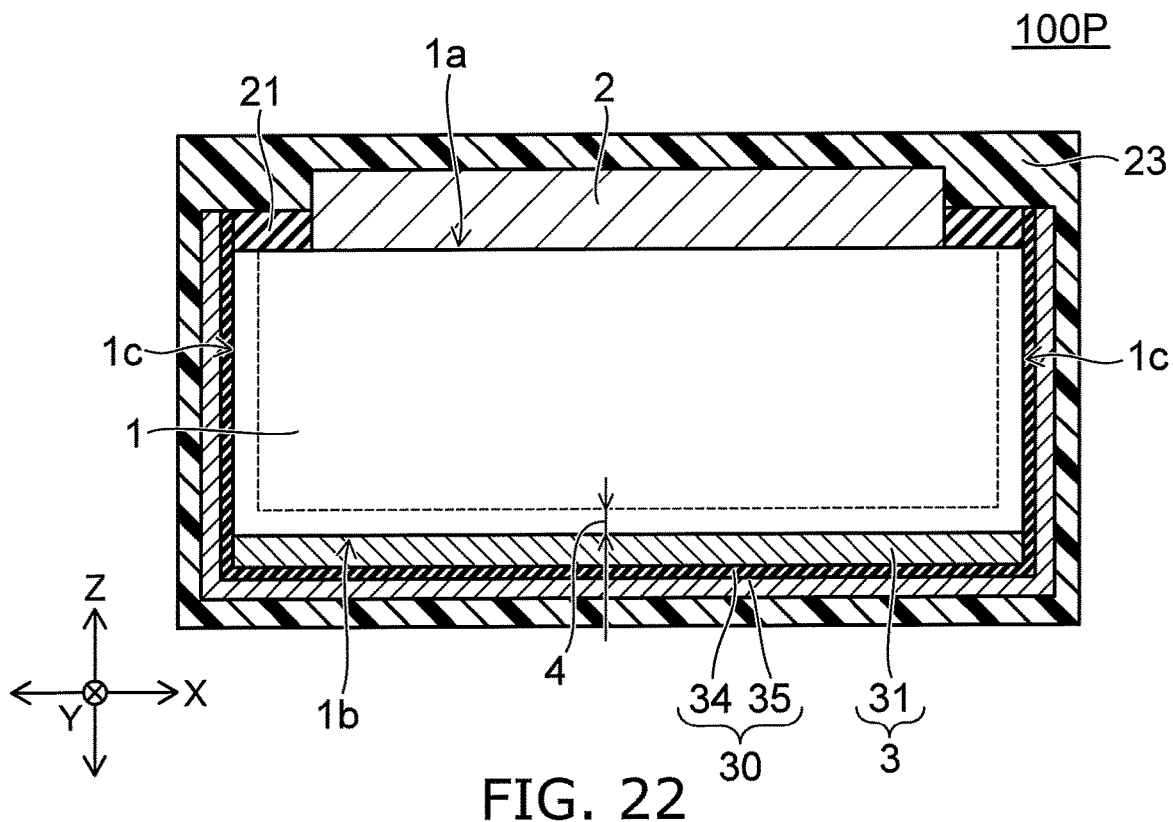
FIG. 22 is a schematic cross-sectional view illustrating a semiconductor device according to a third variation of the second embodiment.

FIG. 22 is a schematic cross-sectional view illustrating a semiconductor device according to a third variation of the second embodiment. Note that the minute unevenness 4 is shown in FIG. 22, omitting the unevenness.

As shown in FIG. 22, in a sixteenth semiconductor chip 100P of the semiconductor device according to the third variation of the second embodiment, the film 30 includes the fourth film 34 and a fifth film 35. The fifth film 35 is one film, for example, provided continuous from on the film 3 including the first film to on the side surface 1c of the substrate 1, the same as the fourth film 34. The one film is, for example, a film with an integral structure. In the third variation of the second embodiment, the fourth film 34 is provided between the fifth film 35 and film 3 including the first film 31, and between the fifth film 35 and the side surface 1c of the substrate 1.

In the third variation of the second embodiment, the function of the fifth film 35 includes, for example:

mitigating the force of the device layer 2 that attempts to deform the substrate 1. The fifth film 35, for example, as well as the first film 31, suppresses deformation of the substrate 1. The fifth film 35 is, for example, a stress load layer.

The first film 31 is provided on the second surface 1b of the substrate 1. The first film 31 suppresses deformation of the substrate 1 from on the second surface 1b of the substrate 1. The fifth film 35 is provided on the second surface 1b of the substrate 1, and on the side surface 1c of the substrate 1. The fifth film 35 suppresses deformation of the substrate 1 from both on the second surface 1b of the substrate 1 and on the side surface 1c of the substrate 1. A material the same as the first film 31 of the first embodiment, for example, can be selected for the material of the fifth film 35. A stacked structure for the fifth film 35, for example, can be the same as that of the first film 31 of the first embodiment.

According to the third variation of the second embodiment, for example, an effect can be further obtained where, for example, "warping" and "breaking" of the sixteenth semiconductor chip 100P can be suppressed.

Furthermore, the third variation of the second embodiment includes the film 3 including the first film 31 and the fifth film 35 as stress load layers. According to the third variation of the second embodiment, for example, an advantage can be further obtained where the degree of freedom in relation to adjustment of film stress of a stress load layer increases.

Figure 23:
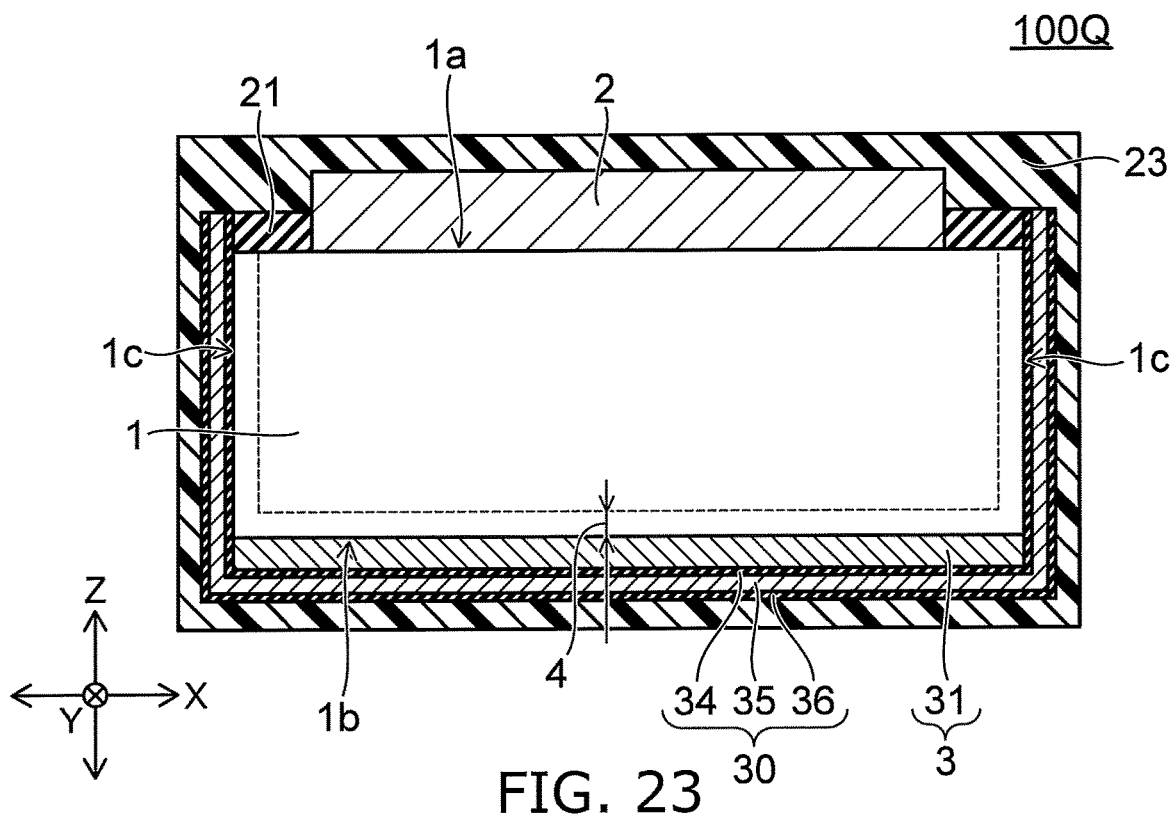
FIG. 23 is a schematic cross-sectional view illustrating a semiconductor device according to a fourth variation of the second embodiment.

FIG. 23 is a schematic cross-sectional view illustrating a semiconductor device according to a fourth variation of the second embodiment. Note that the minute unevenness 4 is shown in FIG. 23, omitting the unevenness.

As shown in FIG. 23, in a seventeenth semiconductor chip 100Q of the semiconductor device according to the fourth variation of the second embodiment, the film 30 includes the fourth film 34, the fifth film 35, and a sixth film 36. The sixth film 36 is one film, for example, provided continuous from on the film 3 to on the side surface 1c of the substrate 1, the same as the fourth film 34 and the fifth film 35. The one film is, for example, a film with an integral structure. In the fourth variation of the second embodiment, the fifth film 35 is provided between the sixth film 36 and the fourth film 34. A material the same as the material of the third film 33 of the first embodiment can be selected for the sixth film 36.

In the fourth variation of the second embodiment, the function of the sixth film 36 includes at least one of the following, for example:

suppressing the diffusion of ions from the fifth film 35 to the mold material 23 (for example, a barrier layer)

insulating the fifth film 35 and the mold material 23 (for example, an insulating layer)

improving the adhesiveness of the fifth film 35 and the mold material 23 (for example, an adhesive layer).

According to the fourth variation of the second embodiment, at least one of the following advantages can be further obtained, for example:

diffusion of ions from the fifth film 35 to the mold material 23 can be suppressed the fifth film 35 can be electrically insulated from the mold material 23 adhesiveness of the fifth film 35 and the mold material 23 improves

In a case where diffusion of ions from the fifth film 35 to the mold material 23 can be suppressed, for example, reliability of the semiconductor device improves.

In a case where the fifth film 35 can be electrically insulated from the mold material 23, for example, reliability of the semiconductor device improves.

In a case where adhesiveness of the fifth film 35 and the mold material 23 improves, for example, reliability of the semiconductor device improves.

Third Embodiment

FIG. 24A to FIG. 24G are procedural schematic views illustrating a method for manufacturing a semiconductor device according to a third embodiment. FIG. 25A to FIG. 25J are procedural schematic cross-sectional views illustrating a method for manufacturing the semiconductor device according to the third embodiment.

Figure 24A:
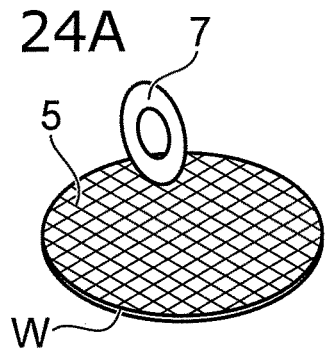
FIG. 24A to FIG. 24G are procedural schematic views illustrating a method for manufacturing a semiconductor device according to a third embodiment.

As shown in FIG. 24A, FIG. 25A, and FIG. 25B, a semiconductor wafer W is diced along the X-axis direction and Y-axis direction. The semiconductor wafer W includes the substrate 1. The semiconductor wafer W has a surface provided with a plurality of device layers 2. A first device layer 2l, a second device layer 2m, and a third device layer 2n are three that are illustrated in FIG. 25A to FIG. 25J. The surface provided with the first device layer 2l to the third device layer 2n is a main surface Wa. The semiconductor wafer W includes the main surface Wa in the Z-axis direction, and a back surface Wb separated from the main surface Wa in the first direction. A dicing line 5 is formed on the diced semiconductor wafer W. The dicing line 5 is a lattice-shaped groove formed on the semiconductor wafer W, along the X-axis direction and the Y-axis direction. Of the dicing lines 5, the dicing lines 5 along the Y-axis direction are shown in FIG. 25B. In the part shown in FIG. 25B, the dicing lines 5 are provided between the first device layer 2l and the second device layer 2m, and also between the second device layer 2m and the third device layer 2n. A width W5 is the width of the dicing line 5. A width W2 is the width between the device layer 2. In FIG. 25B, the width in the X-axis direction of the dicing line 5 is shown as the width W5, and the width in the X-axis direction between the first device layer 2l and the second device layer 2m is shown as the width W2. The width W5 of the dicing line 5 is narrower than the width W2 between the device layer 2. The gap G is formed between the side surface 1c of the substrate 1 and the side surface 2c of the device layer 2. A dicing blade 7 is used, for example, for dicing of the semiconductor wafer W. Dicing is not limited to dicing with the dicing blade 7. Dicing with plasma and dicing with a chemical liquid or the like can also be used for dicing.

Figure 24B:
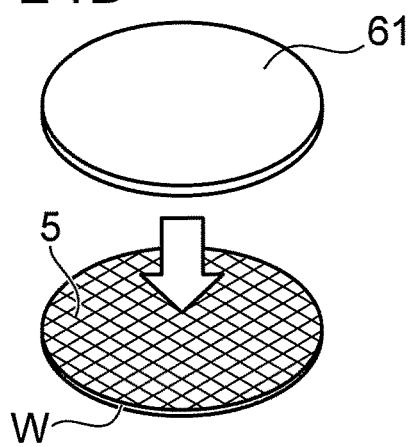

As shown in FIG. 24B and FIG. 25C, a first support member 61 is provided on a first device layer 2l to the third device layer 2n. One example of the first support member 61 is, for example, surface protection tape.

Figure 24C:
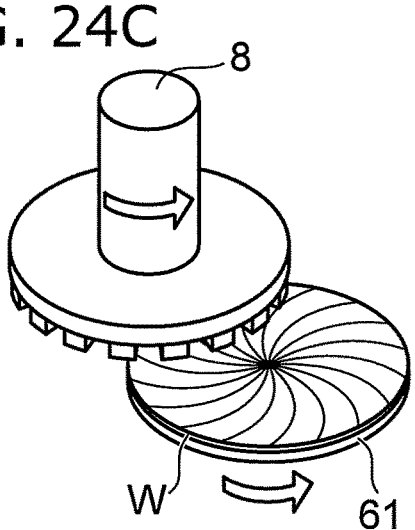

As shown in FIG. 24C, FIG. 25D, and FIG. 25E, the semiconductor wafer W is, for example, turned over, and the back surface Wb of the semiconductor wafer W turns towards a grindstone 8 of a grinding machine. Subsequently, the back surface Wb of the semiconductor wafer W is ground, for example, using the grindstone 8, and the back surface Wb is retracted. The back surface Wb is retracted to reach the dicing lines 5. The semiconductor wafer W is isolated into a plurality of semiconductor chips 100 on the first support member 61. For example, in the part shown in FIG. 25E, the semiconductor wafer W is isolated into the semiconductor chip 100l including the first device layer 2l, the semiconductor chip 100m including the second device layer 2m, and the semiconductor chip 100n including the third device layer 2n, on the first support member 61. The dicing lines 5 become spaces generated between the semiconductor chip 100l and the semiconductor chip 100m, and also between the semiconductor chip 100m and the semiconductor chip 100n. In the Z-axis direction, the side surface 1c of the substrate 1 is separated from each side surface 2c in the first device layer 2l to the third device layer 2n. The side surface 1c of the substrate 1 is separated, from each side surface 2c in the first device layer 2l to the third device layer 2n, for example, by the width in the X-axis direction of the gap G and the width in the Y-axis direction of the gap G. The width in the X-axis direction of the gap G and the width in the Y-axis direction of the gap G are, for example, not less than 5 µm and not greater than 100 µm. The thickness in the Z-axis direction of the first device layer 2l to the third device layer 2n is, for example, from 0.5 to 20 µm. The thickness in the Z-axis direction of the first device layer 2l to the third device layer 2n is modified in various ways according to the design. The first device layer 2l to the third device layer 2n includes, for example, a semiconductor device, an electrical wire, an insulator, and a polyimide from a side of the substrate 1. The thickness from 0.5 to 20 µm in the Z-axis direction of the first device layer 2*l* to the third device layer 2*n* is, for example, the thickness of the semiconductor device and the electrical wire.

Figure 26A:
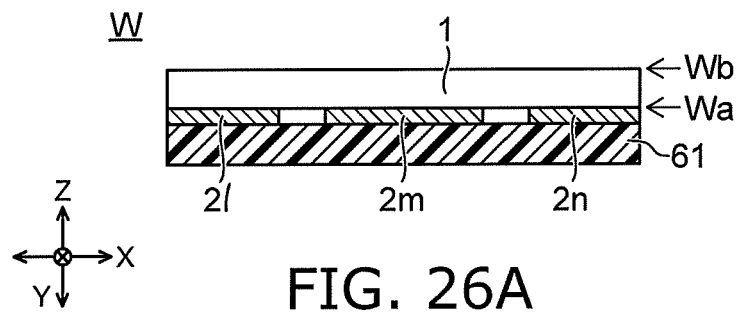
FIG. 26A to FIG. 26C are schematic cross-sectional views illustrating another dicing method.
Figure 26B:
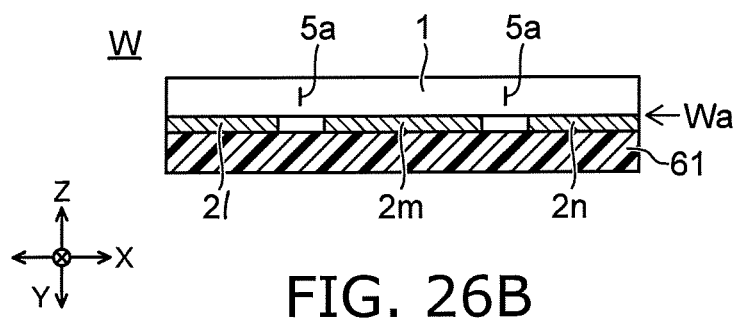
Figure 26C:
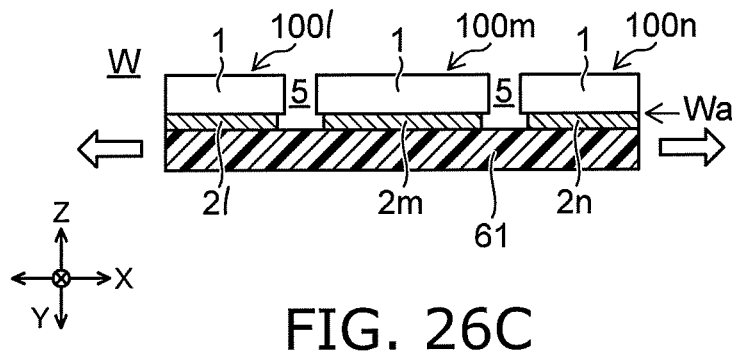

FIG. 26A to FIG. 26C are schematic cross-sectional views illustrating another dicing method.

As shown in FIG. 26A, the back surface Wb of the semiconductor wafer W is retracted, and the semiconductor wafer W is thinned.

As shown in FIG. 26B, a lattice-shaped crack 5*a* is formed on the inner part of the semiconductor wafer W along the X-axis direction and the Y-axis direction. The lattice-shaped crack 5*a* does not, for example, reach the main surface Wa of the semiconductor wafer W and the back surface Wb of the semiconductor wafer W. When the lattice-shaped crack 5*a* is formed on the inner part of the semiconductor wafer W, for example, a transmittable wavelength laser is used on the semiconductor wafer W. The laser is concentrated, for example, to focus on the inner part of the semiconductor wafer W.

As shown in FIG. 26C, for example, the first support member 61 is stretched. The semiconductor wafer W is isolated into the semiconductor chip 100*l* including the first device layer 2*l*, the semiconductor chip 100*m* including the second device layer 2*m*, and the semiconductor chip 100*n* including the third device layer 2*n*, on the first support member 61, the same as the third embodiment. The part wherein the lattice-shaped crack 5*a* is formed becomes the dicing line 5.

When the semiconductor wafer W is diced, this kind of dicing method may be used.

Figure 24D:
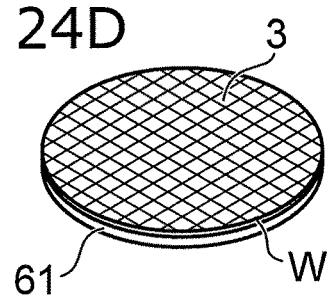

As shown in FIG. 24D and FIG. 25F, on the first support member 61, the film 3 is formed on the second surface 1*b* of the substrate 1 in each semiconductor chip 100*l* to 100*n*, and on the side surface 1*c* of the substrate 1.

The film 3 includes, for example, the first film 31, the second film 32, and the third film 33 of the first embodiment. Illustrations of the first film 31 to the third film 33 are omitted in FIG. 25F to FIG. 25J. The first film 31 to the third film 33 are formed, for example, using physical vapor deposition. The sputtering method can be given as an example of physical vapor deposition. According to physical vapor deposition, for example, the sputtering method, the first film 31, the second film 32, and the third film 33 can each be formed at a low temperature. For example, the first film 31, the second film 32, and the third film 33 can each be formed at the heat resistance temperature or less of the first support member 61. Thus, when forming the first film 31, the second film 32, and the third film 33, deformation or the like due to heat of, for example, the first support member 61, can be suppressed. The heat resistant temperature of the first support member 61 is, for example, from 100 to not higher than 150° C.

In a case where the film 3 is formed using physical vapor deposition, for example, the sputtering method, the film 3 is formed on the second surface 1*b* of the substrate 1, on the side surface 1*c* of the substrate 1, and on the first support member 61 exposed to the bottom of the dicing lines 5. In the gap G, the substrate 1 overhangs on the first support member 61. The side surface 2*c* of the first device layer 2*l* to the third device layer 2*n* exists in a space enclosed by the overhanging part of the substrate 1 and the first support member 61. The length in the X-axis direction and the Y-axis direction of the space is, for example, from 5 μm to 100 μm. The material for forming the film 3 is unlikely to enter the space. The film 3 is not formed, for example, on the side surface 2*c* of the first device layer 2*l* to the third device layer 2*n*. The film 3 is separated by a part formed on the side surface is of the substrate 1, and a part formed on the first support member 61.

The film 3 can also be formed with another physical vapor deposition, for example, chemical vapor deposition (CVD method). In a case where a resin is used, for example, in the film 3, the film 3 can be formed with a coating method.

Figure 24E:
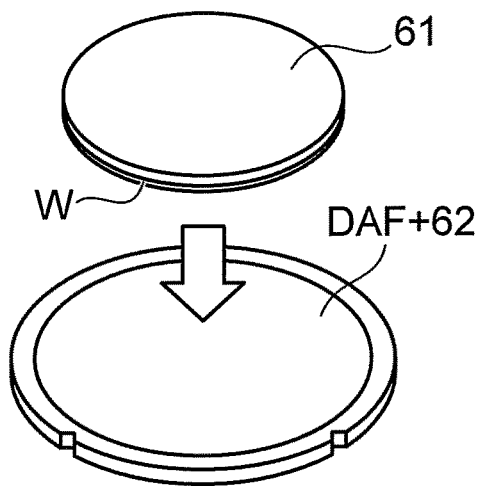

As shown in FIG. 24E, FIG. 25G, and FIG. 25H, for example, the semiconductor wafer W is turned over. Next, a second support member 62 is provided on the film 3. The second support member 62 is, for example, dicing tape. The dicing tape may be an integrated dicing tape having, for example, die attach film DAF. The dicing tape may also be a dicing tape having an adhesive material without DAF.

Figure 24F:
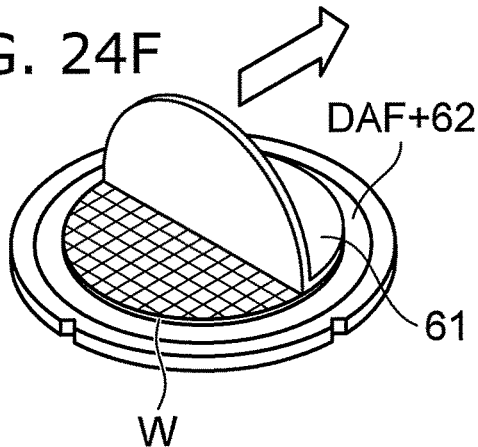

As shown in FIG. 24F and FIG. 25I, the first support member 61 is peeled off from on the first device layer 2*l* to the third device layer 2*n*.

Figure 24G:
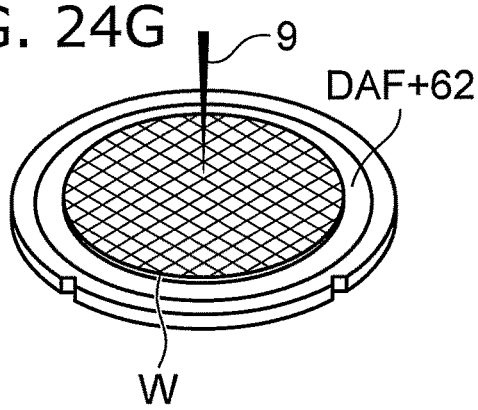

As shown in FIG. 24G and FIG. 25J, the second support member 62 is cut along the dicing lines 5, to a part in the middle along the Z-axis direction. In the third embodiment, for example, a part of DAF of the second support member 62 is cut. The semiconductor chips 100*l* to 100*n* each become semiconductor chips 100*l* to 100*n* with DAF attached. A laser 9 is used, for example, on the cut of the DAF and the second support member 62. A dicing blade may also be used, for example, on the cut of the DAF and the second support member 62. The DAF may, for example, extend and cleave the second support member 62 under cooling.

Following this, the second support member 62 is, for example, stretched. Subsequently, for example, a push-up pin that is not shown is used, and of the semiconductor chips 100*l* to 100*n*, for example, one is pushed out from on the second support member 62. Following this, of the semiconductor chips 100*l* to 100*n*, for example, one is taken out from on the second support member 62.

By doing so, the semiconductor chips 100*l* to 100*n* are formed. The semiconductor chips 100*l* to 100*n* are provided with the film 3 on the second surface 1*b* of the substrate 1, and on the side surface 1*c* of the substrate 1.

Fourth Embodiment

FIG. 27A to FIG. 27F are procedural schematic views illustrating a method for manufacturing a semiconductor device according to a fourth embodiment. FIG. 28A to FIG. 28J and FIG. 29A to FIG. 29D are procedural schematic cross-sectional views illustrating a method for manufacturing the semiconductor device according to the fourth embodiment.

Figure 27A:
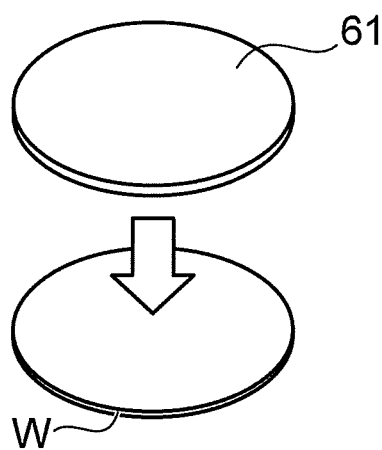
FIG. 27A to FIG. 27F are procedural schematic views illustrating a method for manufacturing a semiconductor device according to a fourth embodiment.

As shown in FIG. 27A, FIG. 28A, and FIG. 28B, the first support member 61 is provided on the first device layer 2*l* to the third device layer 2*n*. One example of the first support member 61 is, for example, surface protection tape.

Figure 27B:
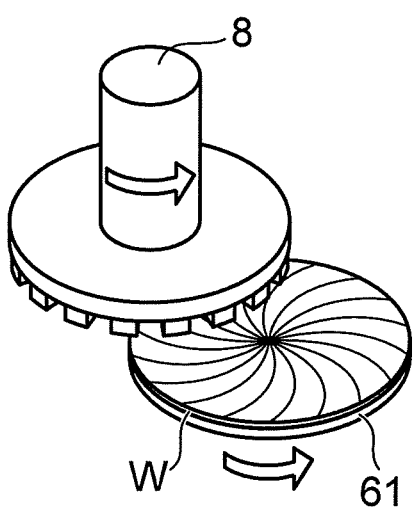

As shown in FIG. 27B and FIG. 28C, for example, the semiconductor wafer W is turned over. Subsequently, the back surface Wb is ground, for example, using the grindstone 8, and retracted.

Figure 27C:
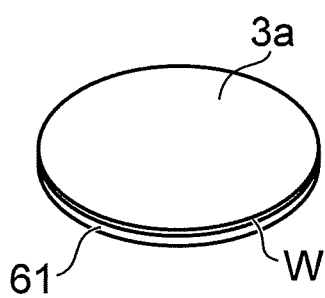

As shown in FIG. 27C and FIG. 28D, on the first support member 61, the film 3 is formed on the back surface Wb of the retracted semiconductor wafer W.

The film 3 includes, for example, the first film 31 and the second film 32 of the second embodiment. Illustrations of the first film 31 and the second film 32 are omitted in FIG. 28D to FIG. 28J. The first film 31 and the second film 32 are formed using, for example, physical vapor deposition. The sputtering method can be given as an example of physical vapor deposition.

Figure 27D:
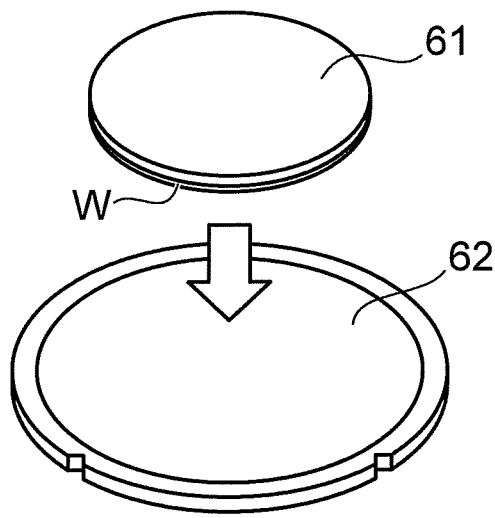

As shown in FIG. 27D and FIG. 28E, for example, the semiconductor wafer W is turned over. Next, the second support member 62 is provided on the film 3. One example of the second support member 62 is, for example, dicing tape.

Figure 27E:
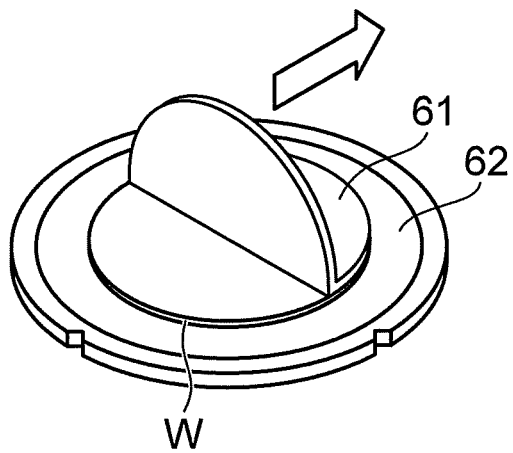

As shown in FIG. 27E and FIG. 28F, the first support member 61 is peeled off from the main surface Wa of the semiconductor wafer W.

Figure 27F:
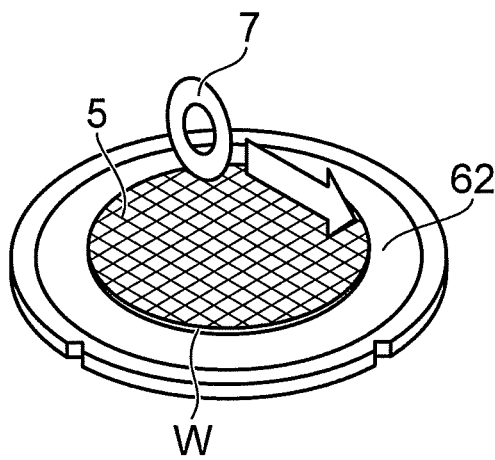

As shown in FIG. 27F and FIG. 28G, on the second support member 62, for example, the semiconductor wafer W is diced along the X-axis direction and Y-axis direction using the dicing blade 7. The semiconductor wafer W is isolated into a plurality of semiconductor chips 100 on the second support member 62. In the part shown in FIG. 28G, the semiconductor wafer W is isolated into the semiconductor chip 100*l* including the first device layer 2*l*, the semiconductor chip 100*m* including the second device layer 2*m*, and the semiconductor chip 100*n* including the third device layer 2*n*, on the second support member 62. The dicing line 5 is formed between the semiconductor chip 100*l* and the semiconductor chip 100*m*, and also between the semiconductor chip 100*m* and the semiconductor chip 100*n*. The width W5 of the dicing line 5 is narrower than the width W2 between the device layer 2. The gap G is formed between the side surface 1*c* of the substrate 1 and the side surface 2*c* of the device layer 2. In FIG. 28G, the width in the X-axis direction of the dicing line 5 is shown as the width W5, and the width in the X-axis direction between the first device layer 2*l* and the second device layer 2*m* is shown as the width W2. The side surface is of the substrate 1 is separated from each side surface 2*c* in the first device layer 2*l* to the third device layer 2*n* by the width in the X-axis direction of the gap G and the Y-axis direction of the gap G.

As shown in FIG. 28H, a third support member 63 is provided on the first device layer 2*l* to the third device layer 2*n*. One example of the third support member 63 is, for example, dicing tape.

As shown in FIG. 28I, for example, the semiconductor wafer W is turned over. Next, the second support member 62 is peeled off from the film 3.

As shown in FIG. 28J, on the third support member 63, the film 30 is formed on the film 3 of each semiconductor chip 100*l* to 100*n*, and on the side surface 1*c* of the substrate 1.

The film 30 includes, for example, the fourth film 34 of the second embodiment. Illustrations of the reference numerals for the fourth film 34 are omitted in FIG. 28J and FIG. 29A to FIG. 29D. The fourth film 34 is formed using, for example, physical vapor deposition. The sputtering method can be given as an example of physical vapor deposition. According to the sputtering method, the film 30 including the fourth film 34 can be formed at a low temperature. For example, the fourth film 34 can be formed at the heat resistance temperature or less of the third support member 63.

In a case where the film 30 is formed using physical vapor deposition, for example, the sputtering method, the film 30 is formed on film 3, on the side surface 1*c* of the substrate 1, and on the third support member 63 exposed to the bottom of the dicing line 5. In the gap G, the substrate 1 overhangs on the third support member 63. The side surface 2*c* of the first device layer 2*l* to the third device layer 2*n* exists in a space enclosed by the overhanging part of the substrate 1 and the third support member 63. The length in the X-axis direction and the Y-axis direction of the space is not less than 5 μm and not more than 100 μm, for example. The material for forming the film 30 is less likely to enter the space. The film 30 is not formed, for example, on the side surface 2*c* of the first device layer 2*l* to the third device layer 2*n*. The film 30 is separated by a part formed on the side surface 1*c* of the substrate 1, and a part formed on the third support member 63.

The film 30 can also be formed with another physical vapor deposition, for example, chemical vapor deposition (CVD method). If a resin is used, for example, in the film 30, the film 30 can be formed with a coating method.

Figure 29A:
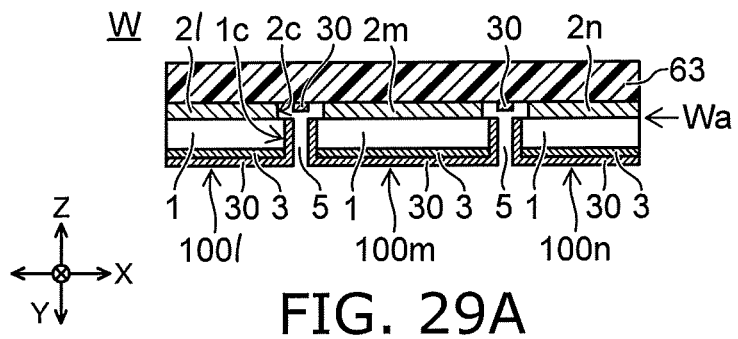
FIG. 29A to FIG. 29D are procedural schematic views illustrating a method for manufacturing a semiconductor device according to a fourth embodiment.
Figure 29B:
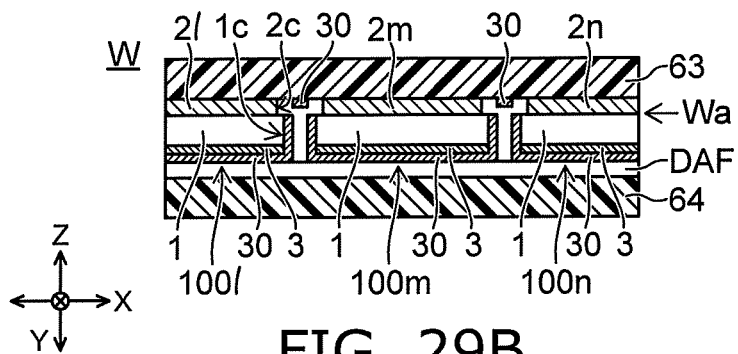

As shown in FIG. 29A and FIG. 29B, for example, the semiconductor wafer W is turned over. Next, a fourth support member 64 is provided on the film 30. The fourth support member 64 is, for example, a tape having an adhesive material. The fourth support member 64 may also have, for example, an adhesive and DAF, as shown.

Figure 29C:
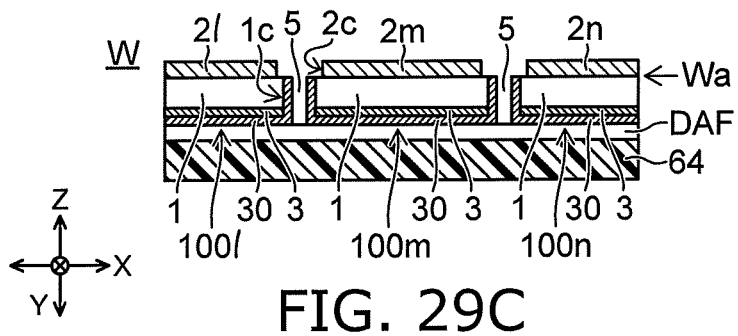

As shown in FIG. 29C, the third support member 63 is peeled off from on the first device layer 2*l* to the third device layer 2*n*.

Figure 29D:
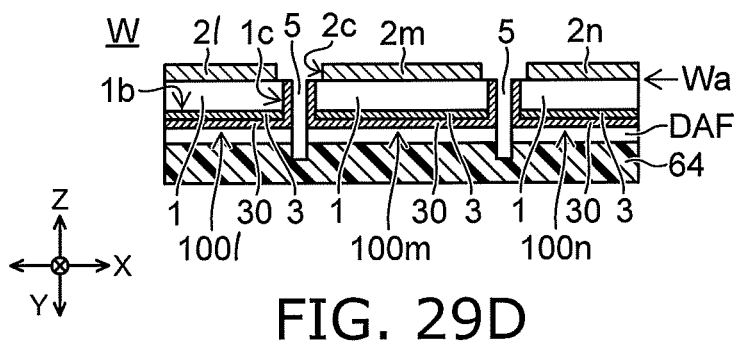

As shown in FIG. 29D, the fourth support member 64 is cut along the dicing line 5, to a part in the middle along the Z-axis direction. In the fourth embodiment, for example, the part of DAF of the fourth support member 64 is cut. The semiconductor chips 100*l* to 100*n* each become semiconductor chips 100*l* to 100*n* with DAF attached. A laser or a dicing blade is used, for example, on the cut of the DAF and the second support member 62. The DAF may also, for example, extend and cleave the second support member 62 under cooling.

Following this, the fourth support member 64 is, for example, stretched. Subsequently, for example, a push-up pin that is not shown is used, and of the semiconductor chips 100*l* to 100*n*, for example, one is pushed out from on the fourth support member 64. Following this, of the semiconductor chips 100*l* to 100*n*, for example, one is taken out from on the fourth support member 64.

By doing so, the semiconductor chips 100*l* to 100*n* are formed. The semiconductor chips 100*l* to 100*n* are provided with the film 30 on the film 3, and on the side surface 1*c* of the substrate 1.

The embodiments described above can provide a semiconductor device that is able to suppress warping and a method for manufacturing the same.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as substrates, device layers, films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a substrate including a first semiconductor element, the substrate including a first surface, a second surface, and a side surface between the first surface and the second surface;
    a device layer including a second semiconductor element electrically connected the first semiconductor element, the device layer being provided on the first surface of the substrate; and
    a film including a first film,
        the film including the first film including a first region, a second region, and a third region, and
        the substrate being positioned between the first region and the device layer in a first direction, and the substrate being positioned between the second region and the third region in a second direction crossing the first direction,
    the first film filling unevenness of the second surface and the side surface.

2. The device according to claim 1, wherein
    the film including the first film further includes:
        a second film, and
    the second film is provided between the substrate and the first film.

3. The device according to claim 1, wherein
    the film including the first film further includes:
        a third film, and
    the first film is provided between the substrate and the third film.

4. The device according to claim 1, wherein the first film includes at least one metal selected from the group consisting of aluminum, gold, copper, nickel, titanium, tantalum, tungsten, and palladium.

5. The device according to claim 1, wherein the first film includes at least one non-metal selected from the group consisting of silicon, silicon nitride, silicon oxide, and resin.

6. The device according to claim 1, wherein the first film includes a stacked structure.

7. The device according to claim 6, wherein the stacked structure includes at least one stacked structure selected from the group consisting of a layer including Ti/layer including Ni, a layer including Ti/layer including Cu, a layer including Ti/layer including Ni/layer including Cu, a layer including Ti/layer including W/layer including Ti, and a layer including Ti/layer including Ni/layer including Cu/layer including Ti.

8. The device according to claim 1, wherein the first region, the second region, and the third region are monolithically formed.

9. The device according to claim 1, wherein the device layer is separated from the film including the first film.

10. The device according to claim 1, wherein the device layer further includes an electric wire, an insulator, and a resin layer.

* * * * *